(12) United States Patent
Sumino et al.

(10) Patent No.: US 11,683,942 B2
(45) Date of Patent: Jun. 20, 2023

(54) MEMORY DEVICE INCLUDING A MEMORY ELEMENT BETWEEN WIRING LAYERS AND METHOD OF MANUFACTURING MEMORY DEVICE

(71) Applicant: SONY SEMICONDUCTOR SOLUTIONS CORPORATION, Kanagawa (JP)

(72) Inventors: Jun Sumino, Kanagawa (JP); Masayuki Tazaki, Kanagawa (JP); Hideyuki Fukata, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 19 days.

(21) Appl. No.: 16/616,233

(22) PCT Filed: May 1, 2018

(86) PCT No.: PCT/JP2018/017405
§ 371 (c)(1),
(2) Date: Nov. 22, 2019

(87) PCT Pub. No.: WO2018/221114
PCT Pub. Date: Dec. 6, 2018

(65) Prior Publication Data
US 2020/0091241 A1 Mar. 19, 2020

(30) Foreign Application Priority Data
May 31, 2017 (JP) .............................. JP2017-107840

(51) Int. Cl.
*H01L 23/522* (2006.01)
*H01L 27/24* (2006.01)
(Continued)

(52) U.S. Cl.
CPC ........ *H01L 27/2463* (2013.01); *H01L 23/528* (2013.01); *H01L 23/5226* (2013.01);
(Continued)

(58) Field of Classification Search
CPC ............. H01L 45/1233; H01L 27/2481; H01L 21/76807; H01L 21/8239;
(Continued)

(56) References Cited

U.S. PATENT DOCUMENTS 9,825,099 B2 * 11/2017 Lee ........................ H01L 45/146
9,858,974 B1 * 1/2018 Kondo ................ G11C 11/1673
(Continued)

FOREIGN PATENT DOCUMENTS

CN 101911295 A 12/2010
EP 2234160 A1 9/2010
(Continued)

OTHER PUBLICATIONS

International Search Report and Written Opinion of PCT Application No. PCT/JP2018/017405, dated Jul. 17, 2018, 14 pages of ISRWO.

*Primary Examiner* — Marcos D. Pizarro
*Assistant Examiner* — William Henry Anderson
(74) *Attorney, Agent, or Firm* — Chip Law Group

(57) ABSTRACT

A memory device according to an embodiment of the present disclosure includes: a logic circuit in which a plurality of wiring layers including layers that are different in wiring pitches is stacked; and a memory element that is provided between the plurality of wiring layers.

10 Claims, 21 Drawing Sheets

(51) Int. Cl.
 *H01L 23/528* (2006.01)
 *H01L 45/00* (2006.01)
(52) U.S. Cl.
 CPC .......... *H01L 27/2427* (2013.01); *H01L 45/08* (2013.01); *H01L 45/1233* (2013.01); *H01L 45/144* (2013.01); *H01L 45/16* (2013.01)
(58) Field of Classification Search
 CPC ......... H01L 45/04–065; H01L 27/2409; H01L 27/2418; H01L 27/2427; G11C 2213/77; G11C 2213/78
 See application file for complete search history.

(56) References Cited

U.S. PATENT DOCUMENTS

| | | | | |
|---|---|---|---|---|
| 2006/0098469 | A1* | 5/2006 | Yang | H01L 27/1104 257/E27.099 |
| 2008/0237886 | A1* | 10/2008 | Wu | G11C 13/0023 257/776 |
| 2010/0283026 | A1 | 11/2010 | Mikawa et al. | |
| 2011/0272664 | A1* | 11/2011 | Tada | H01L 45/04 257/4 |
| 2012/0097916 | A1 | 4/2012 | Tada et al. | |
| 2015/0372055 | A1* | 12/2015 | Chen | H01L 27/2436 257/421 |
| 2016/0284993 | A1 | 9/2016 | Tada et al. | |
| 2017/0148983 | A1* | 5/2017 | Lee | H01L 45/1233 |
| 2017/0256587 | A1* | 9/2017 | Tsuji | H03K 19/1735 |
| 2018/0033826 | A1* | 2/2018 | Choi | H01L 45/1233 |
| 2020/0350364 | A1* | 11/2020 | Wan | H01L 27/224 |

FOREIGN PATENT DOCUMENTS

| | | |
|---|---|---|
| JP | 2008-091519 A | 4/2008 |
| JP | 2013-239728 A | 11/2013 |
| JP | 2014238897 A | 12/2014 |
| TW | 201448215 A | 12/2014 |
| WO | 2009/081595 A1 | 7/2009 |
| WO | 2010/079816 A1 | 7/2010 |
| WO | 2010/150720 A1 | 12/2010 |

* cited by examiner

[FIG. 1]
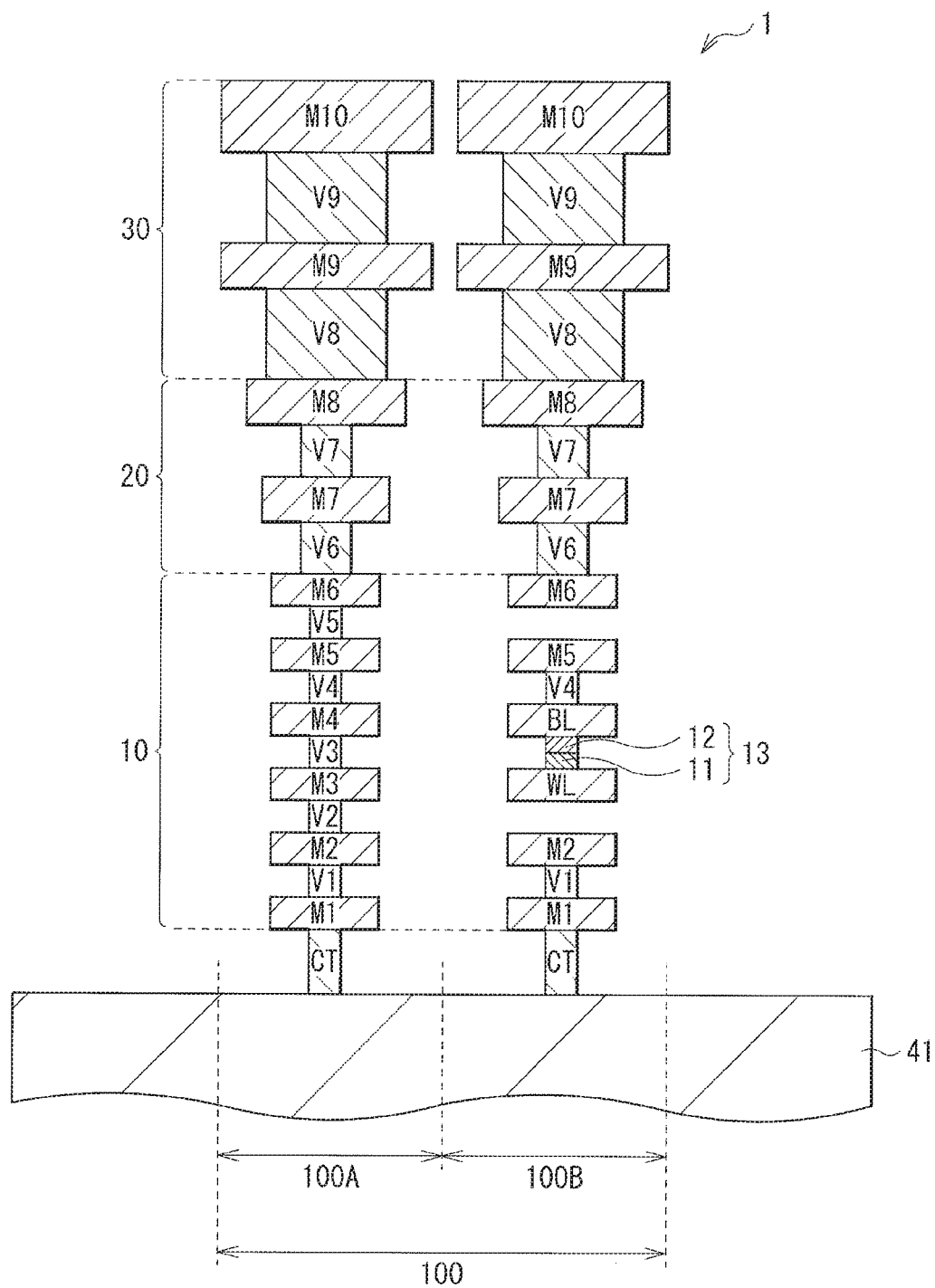

[FIG. 2]
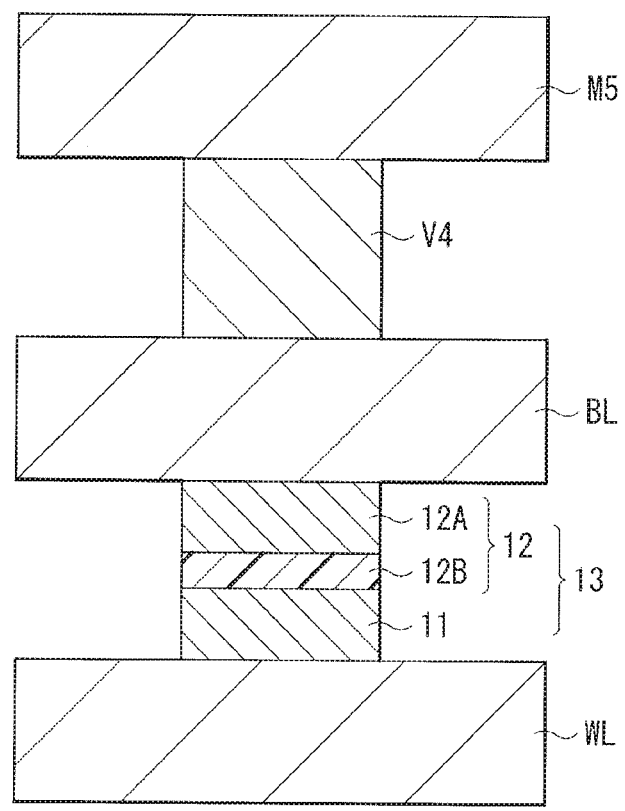

[ FIG. 3A ]
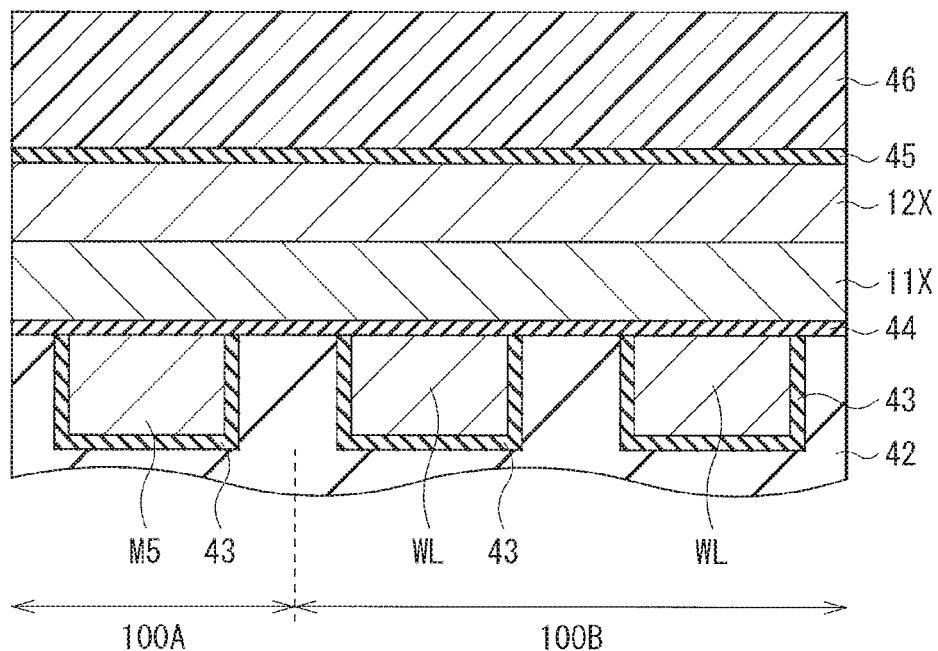
[ FIG. 3B ]
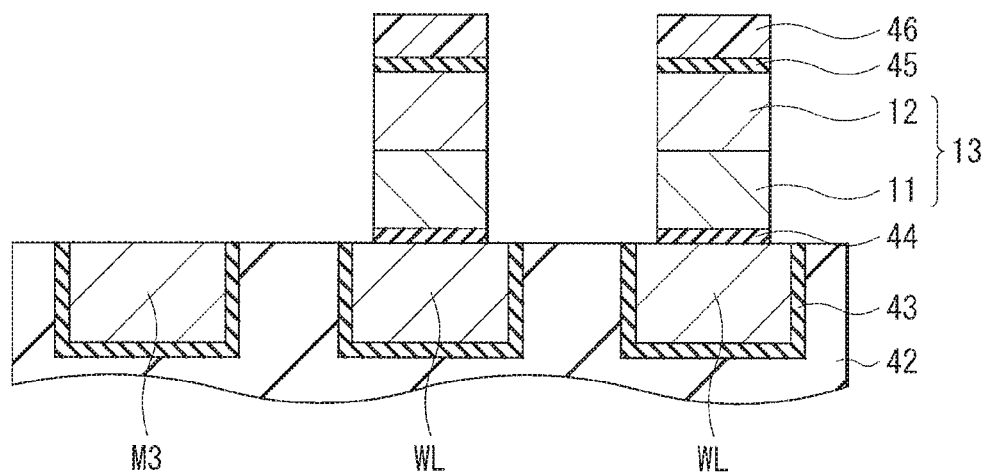

[ FIG. 3C ]
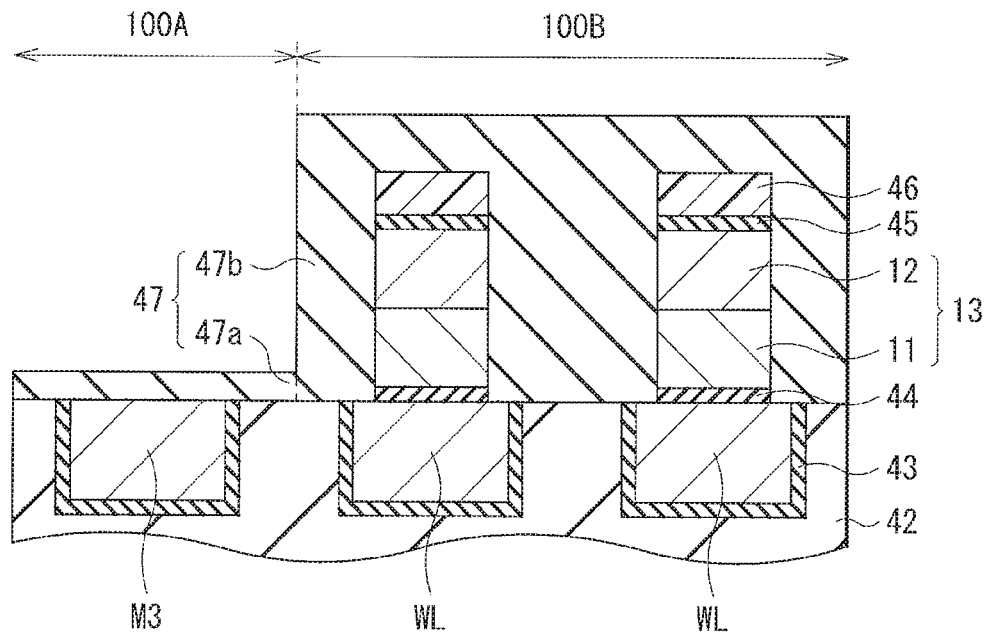
[ FIG. 3D ]
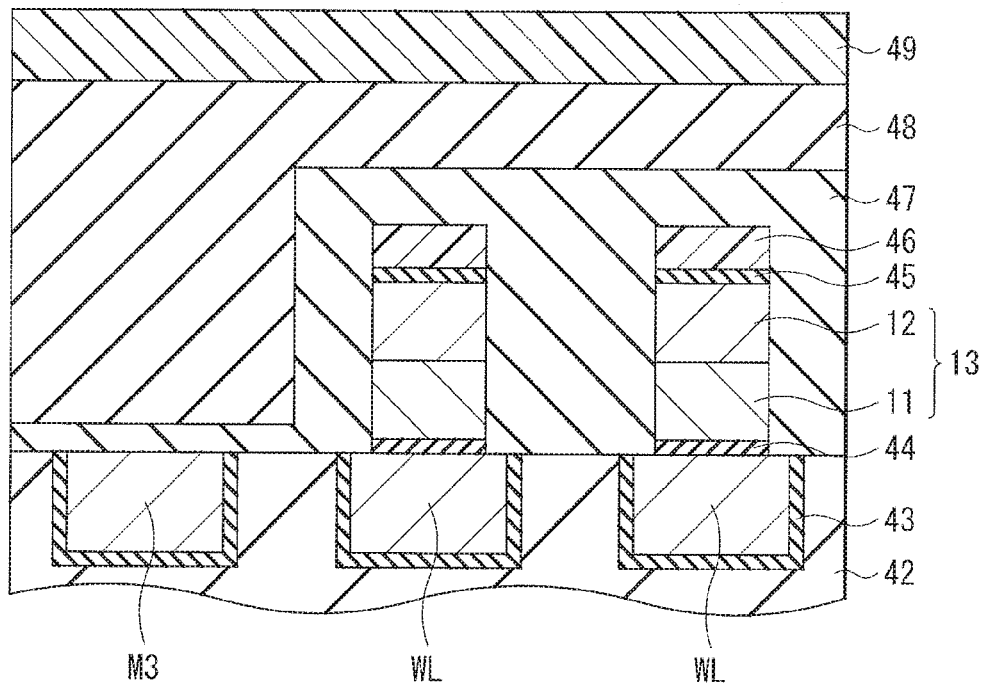

[FIG. 3E]
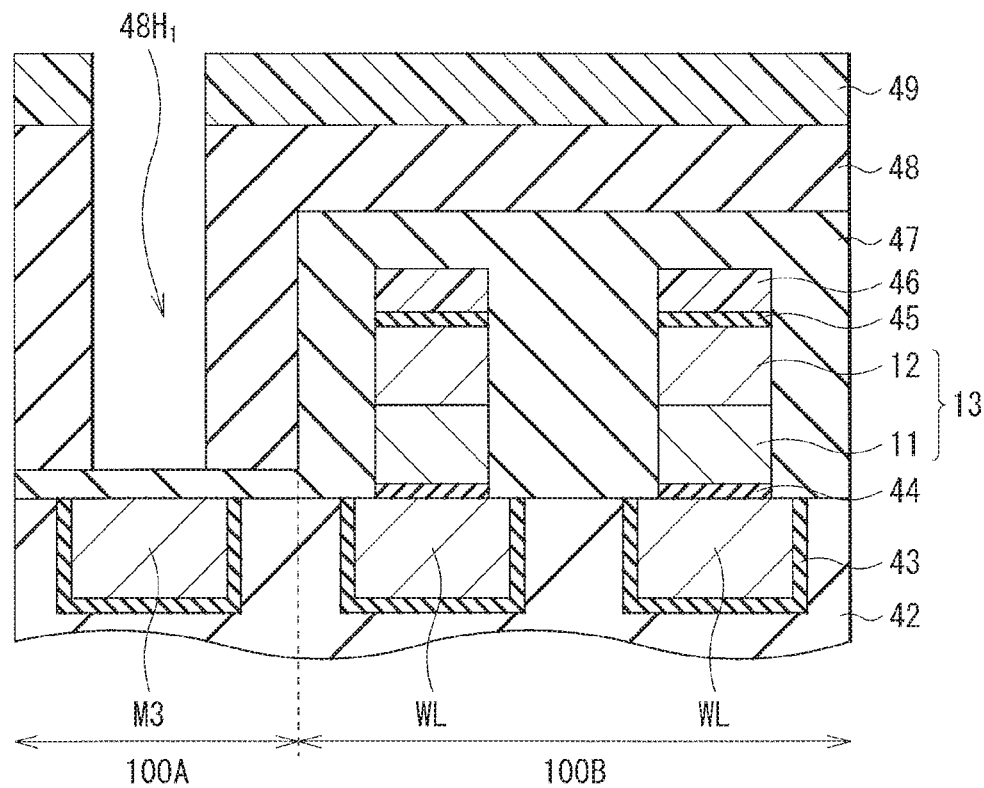
[FIG. 3F]
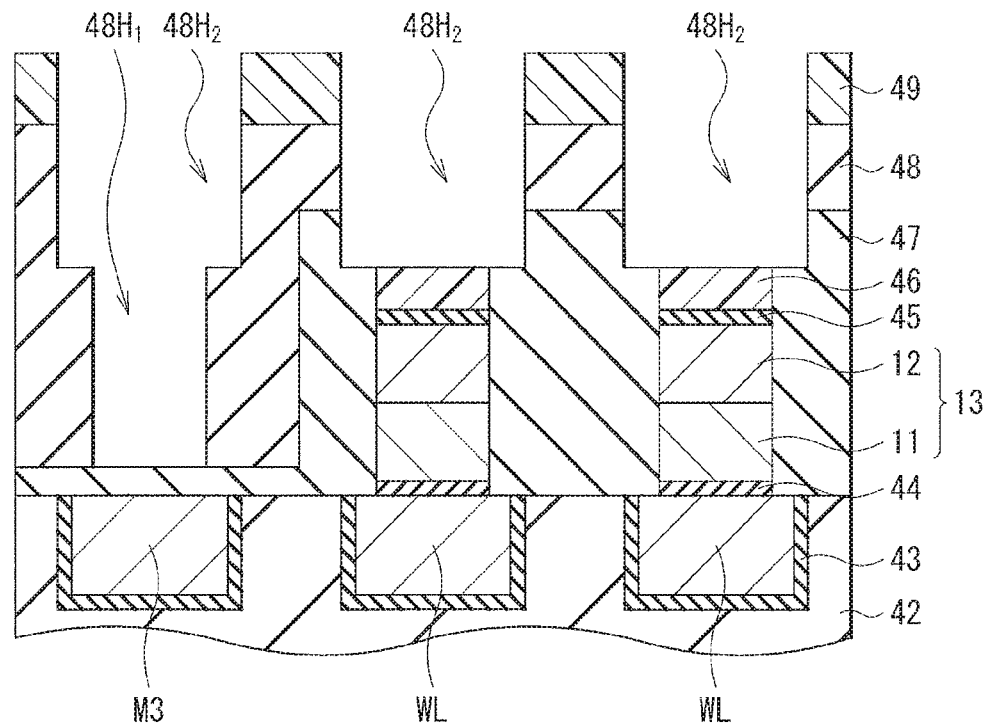

[ FIG. 3G ]
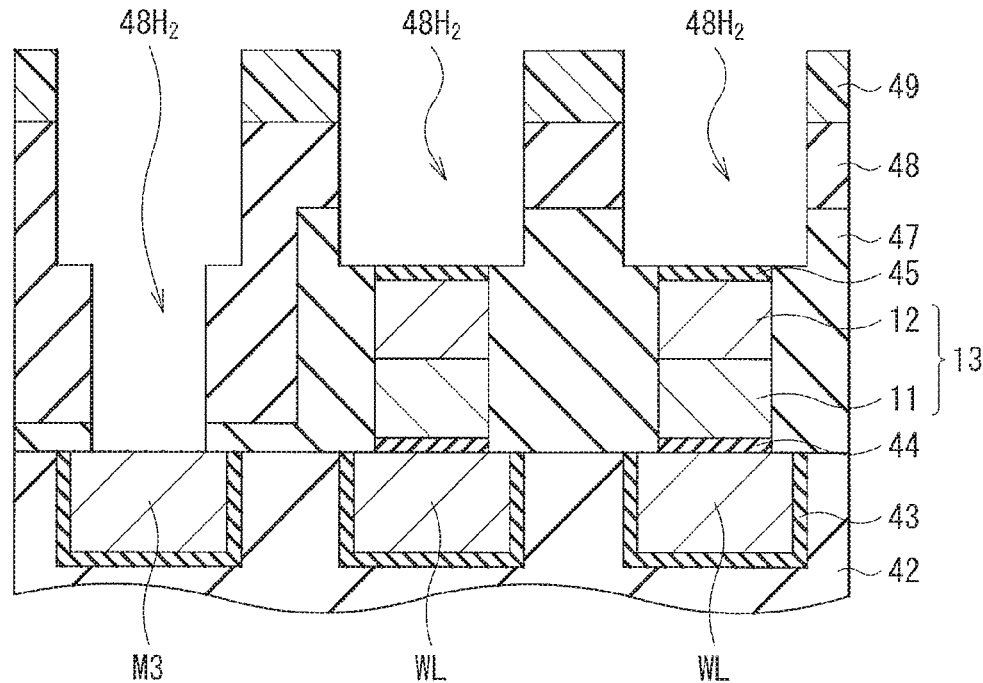
[ FIG. 3H ]
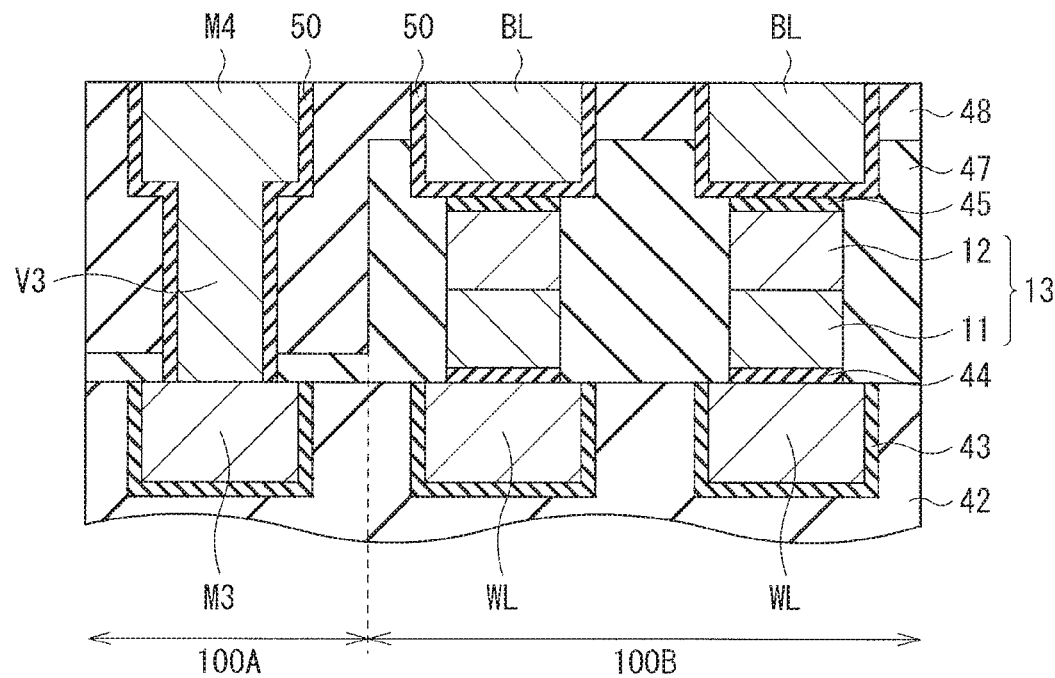

[FIG. 4]
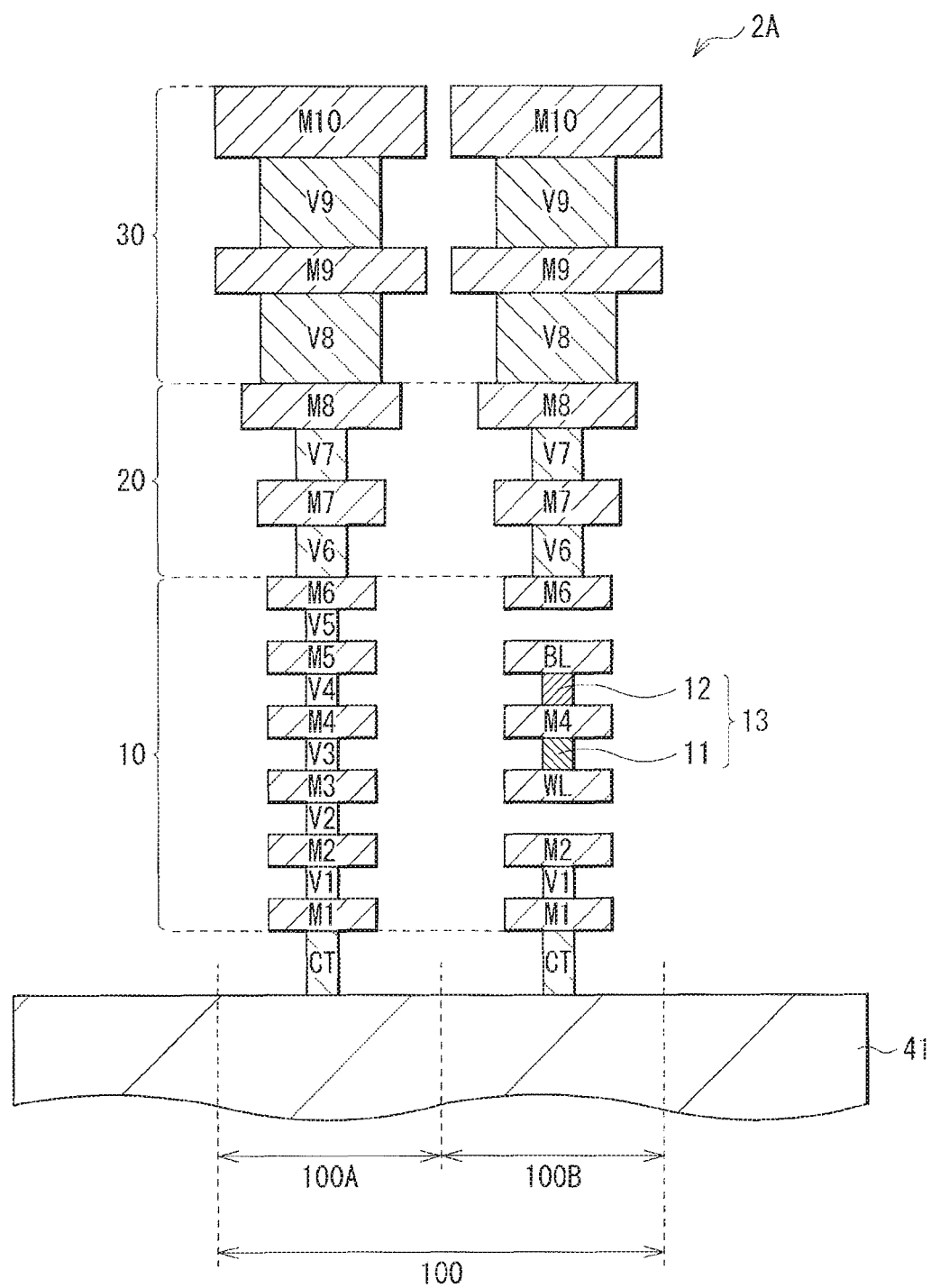

[FIG.5]
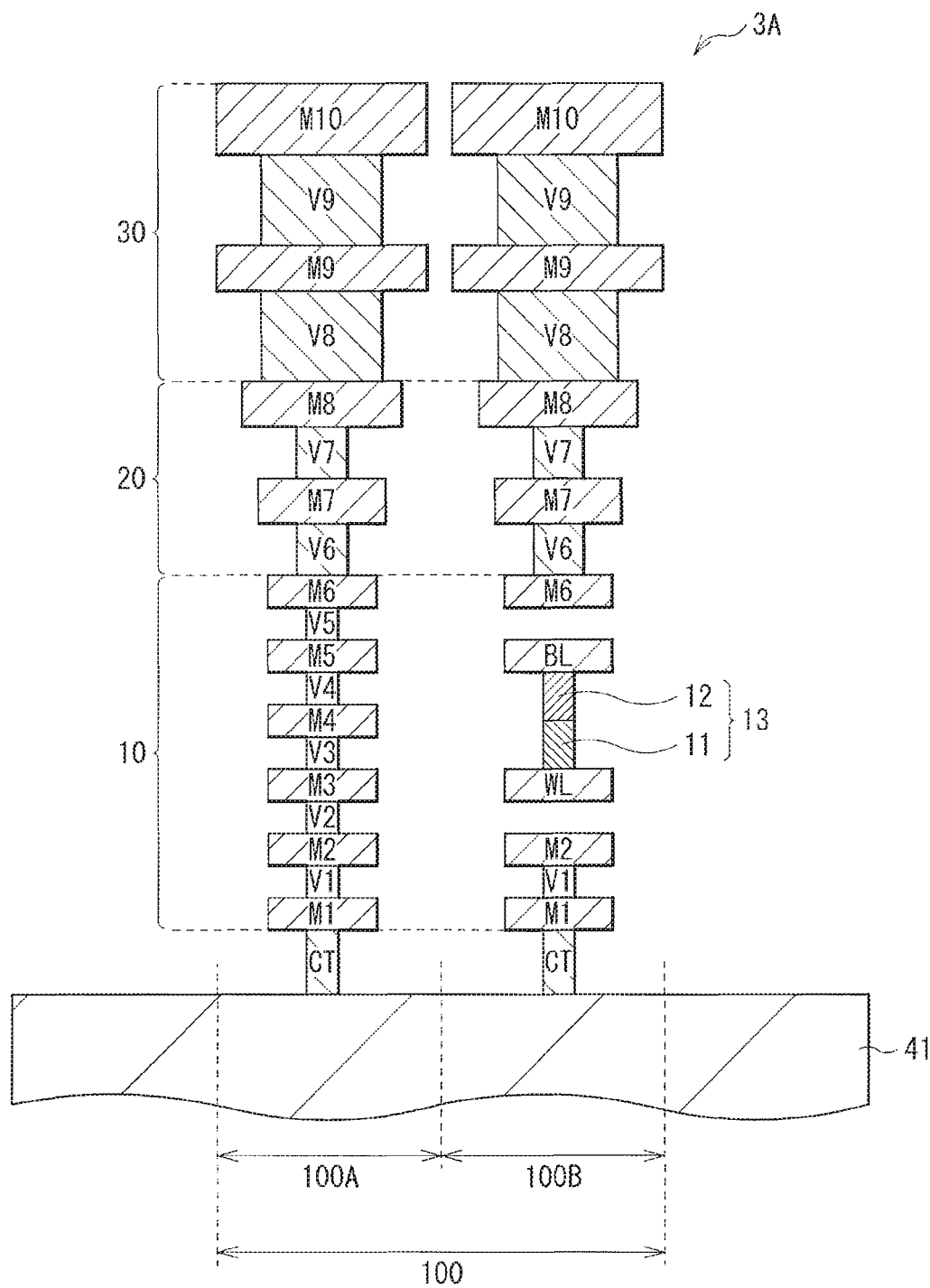

[FIG. 6]
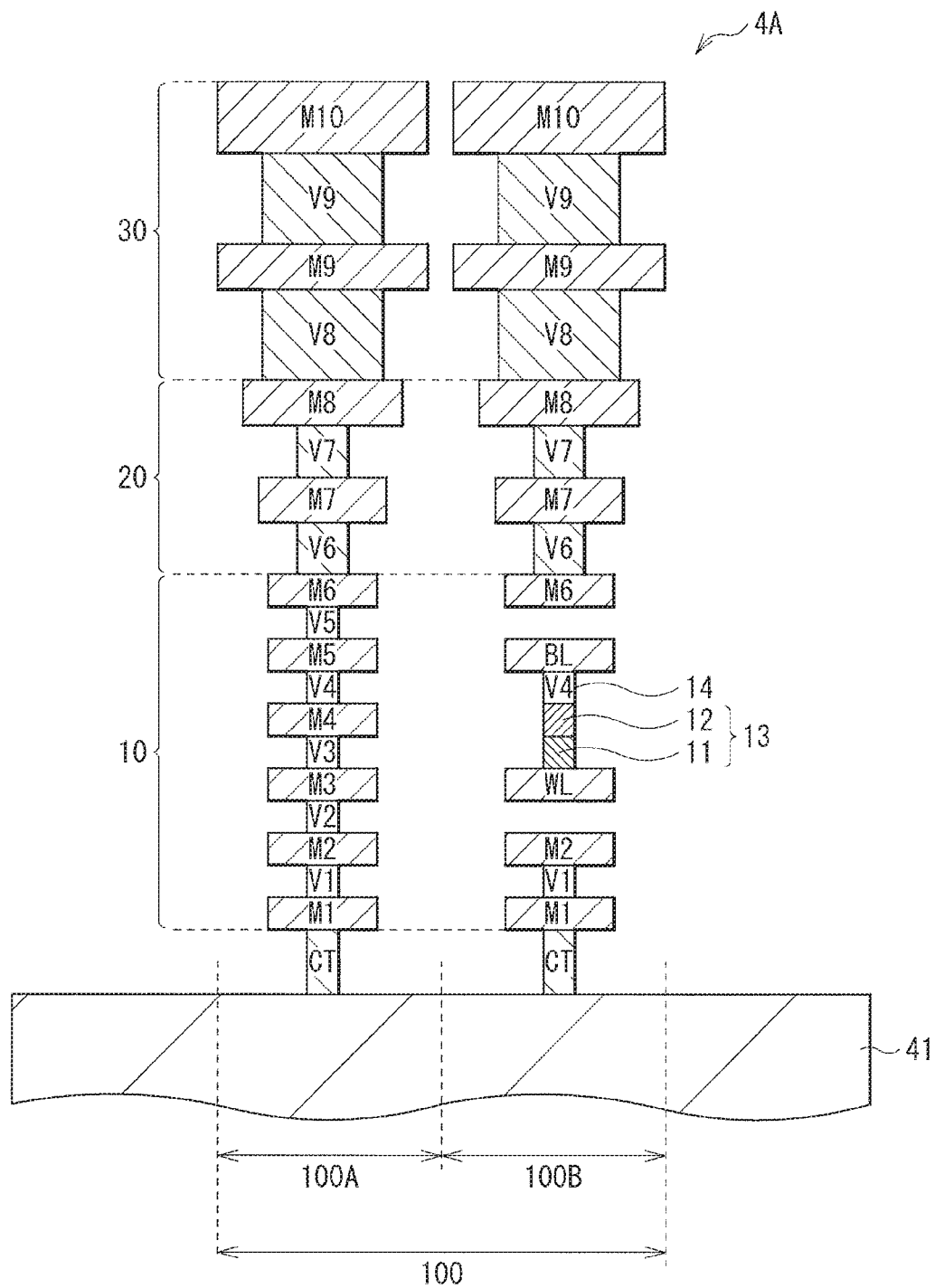

[FIG. 7]
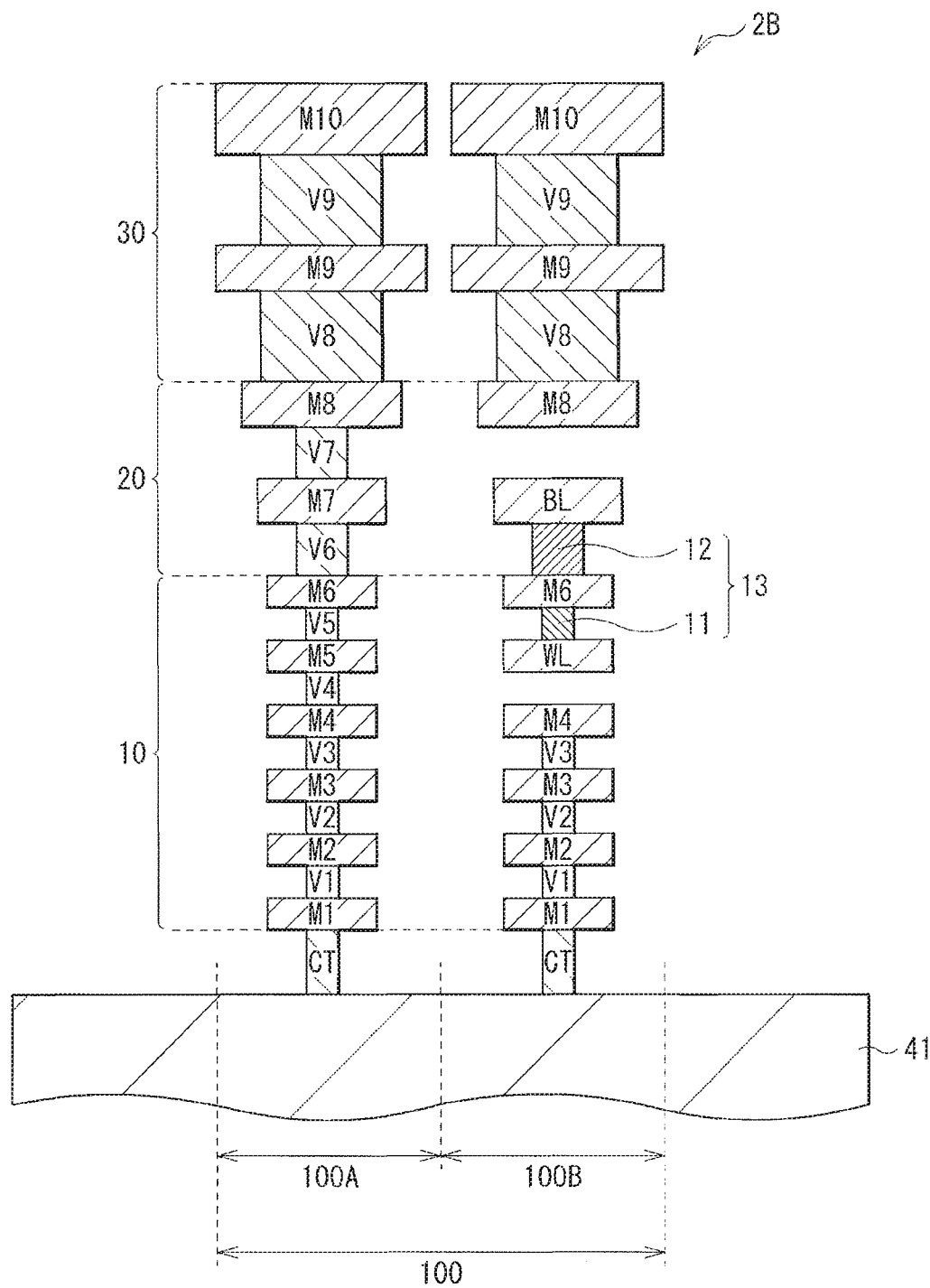

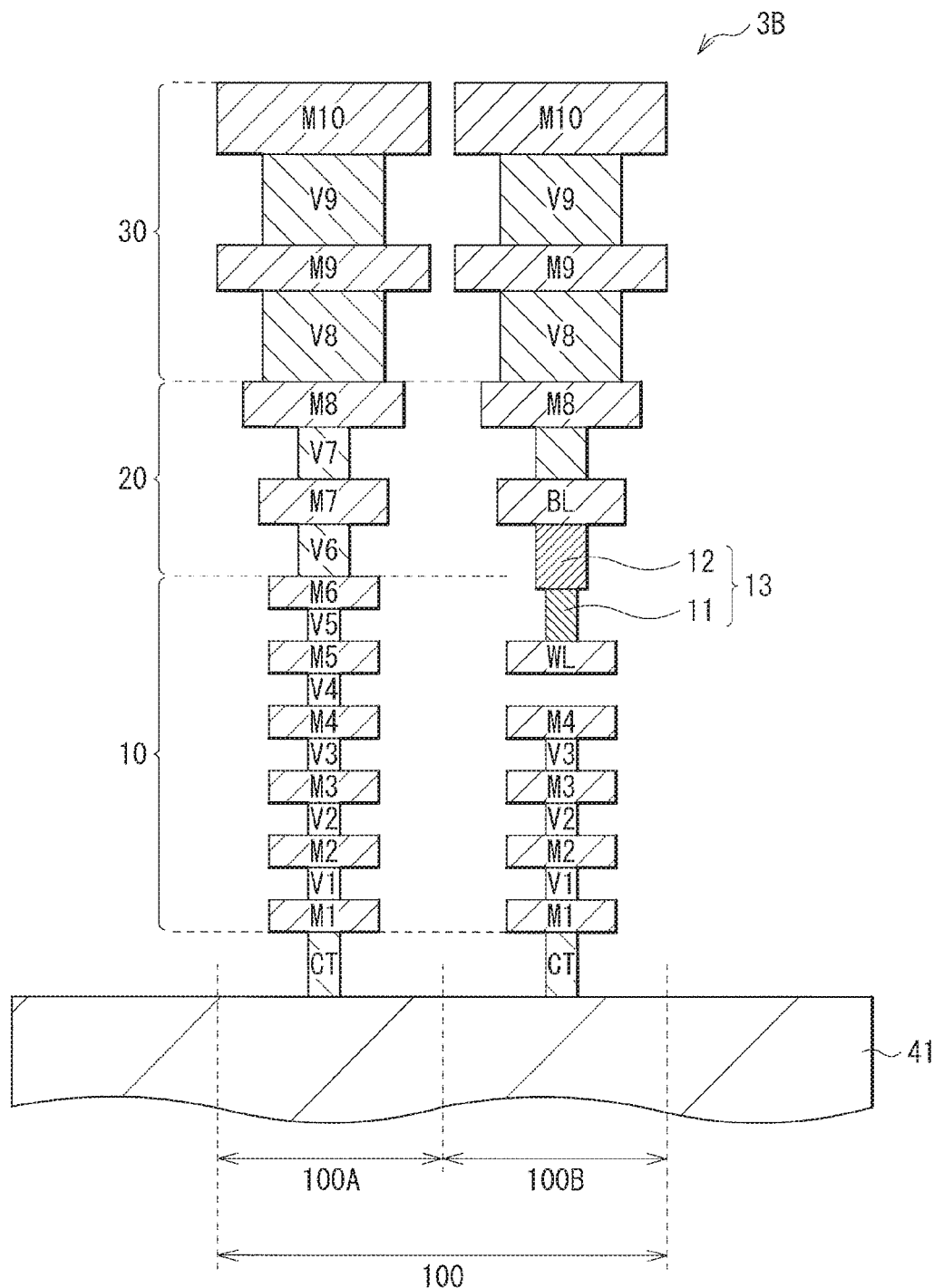
[FIG. 8]

[FIG. 9]
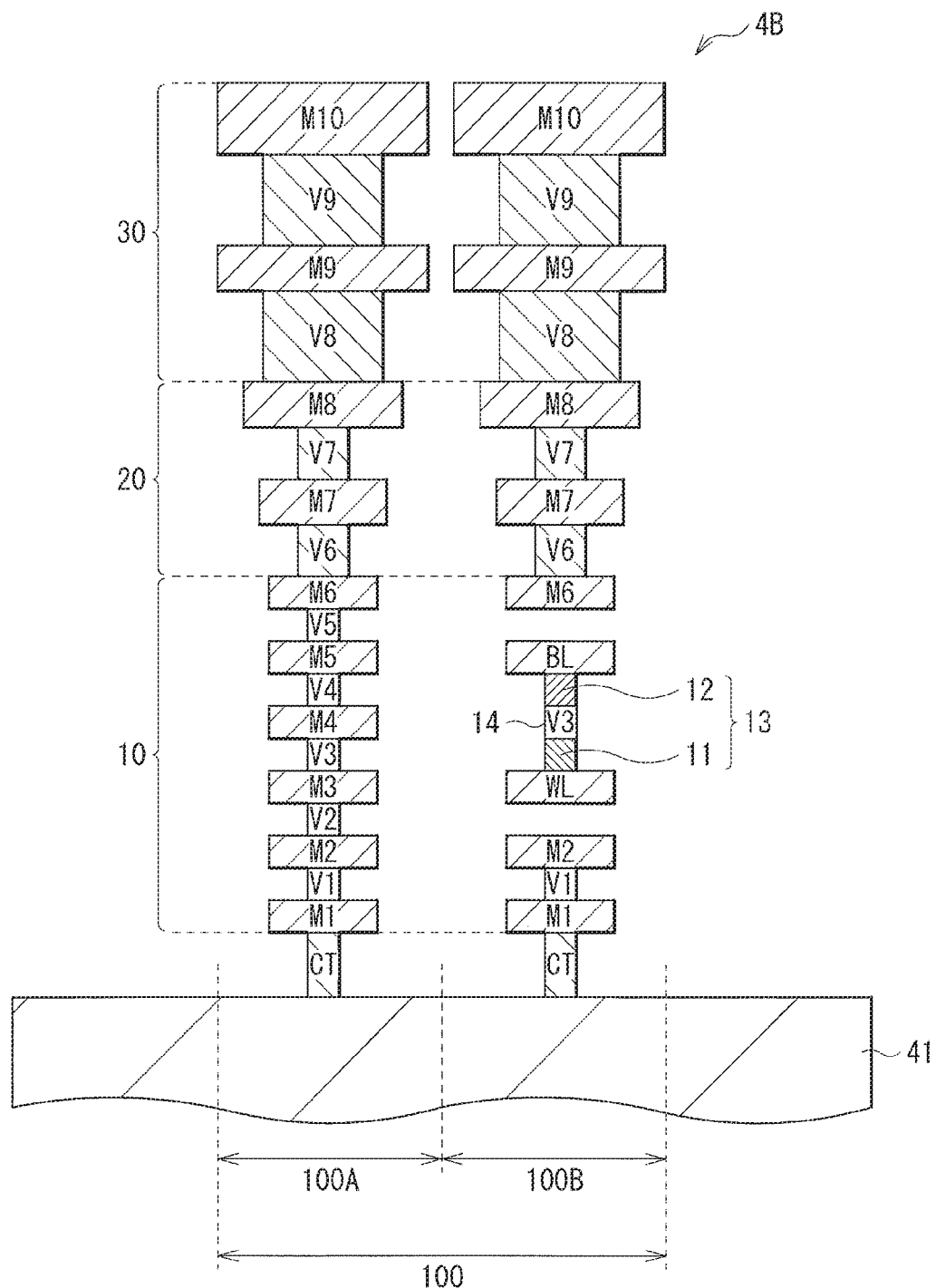

[ FIG. 10A ]
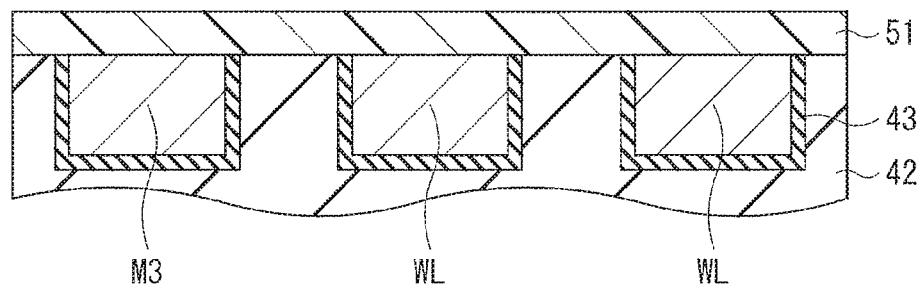
[ FIG. 10B ]
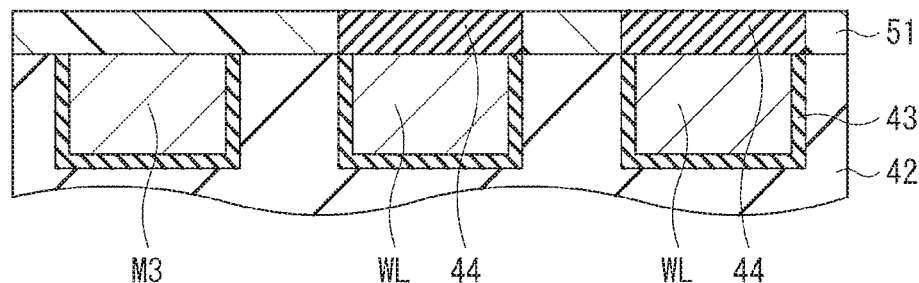
[ FIG. 10C ]
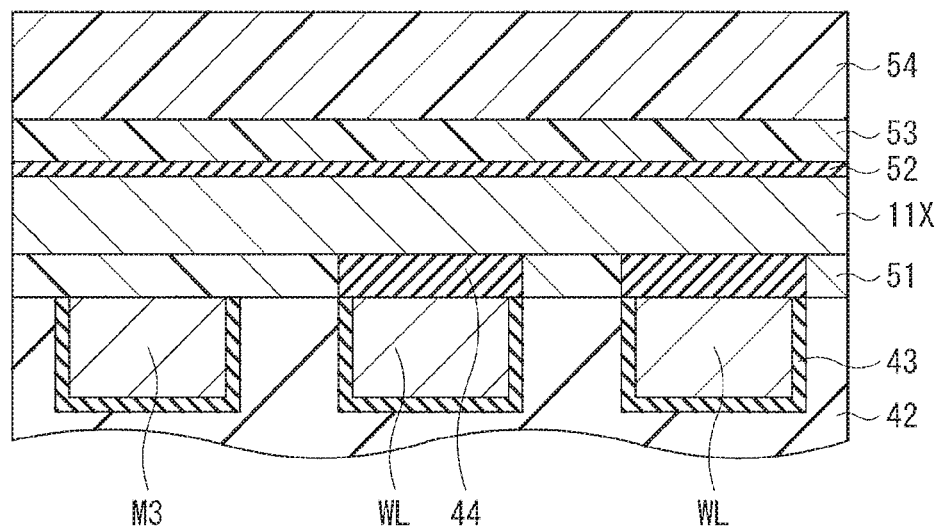

[FIG. 10D]
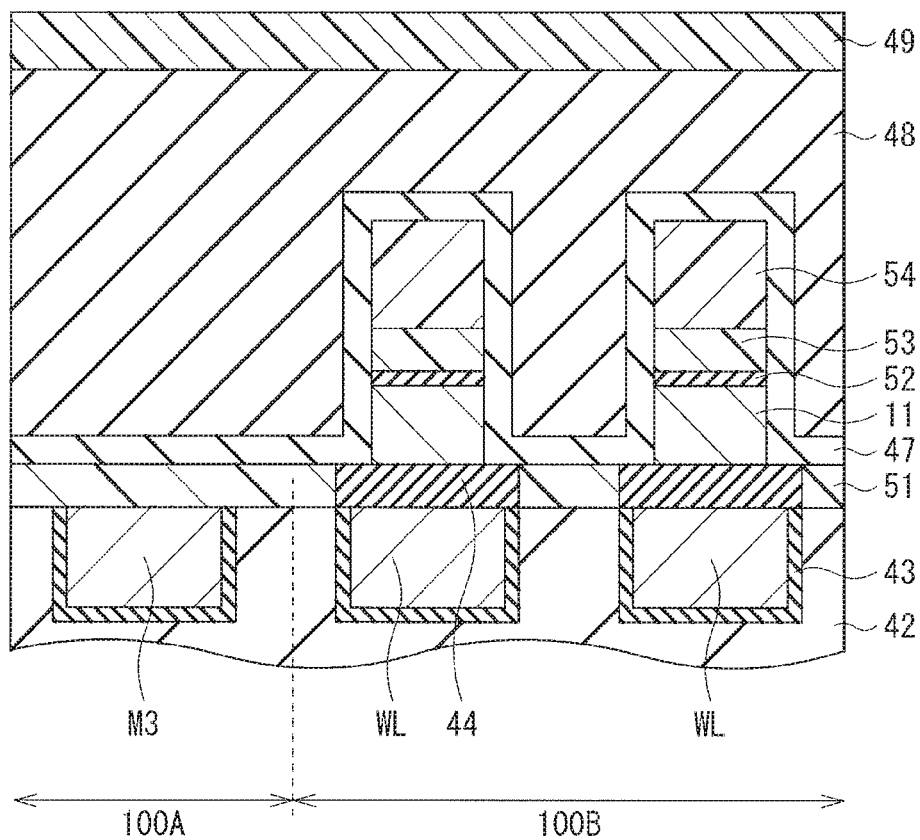

[ FIG. 10E ]
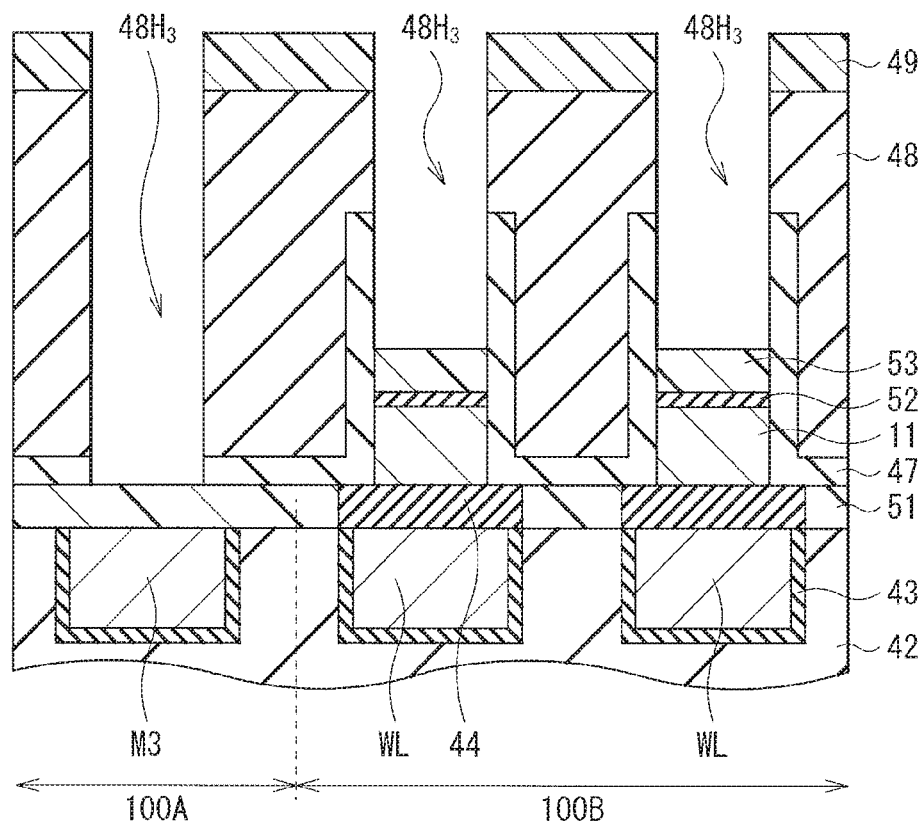

[ FIG. 10F ]
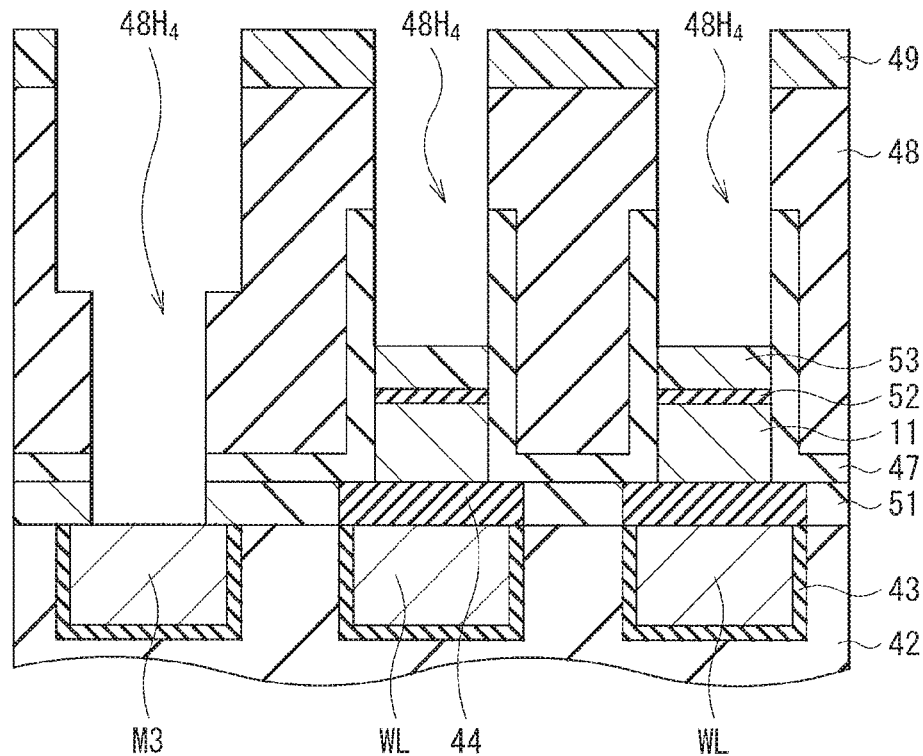
[ FIG. 10G ]
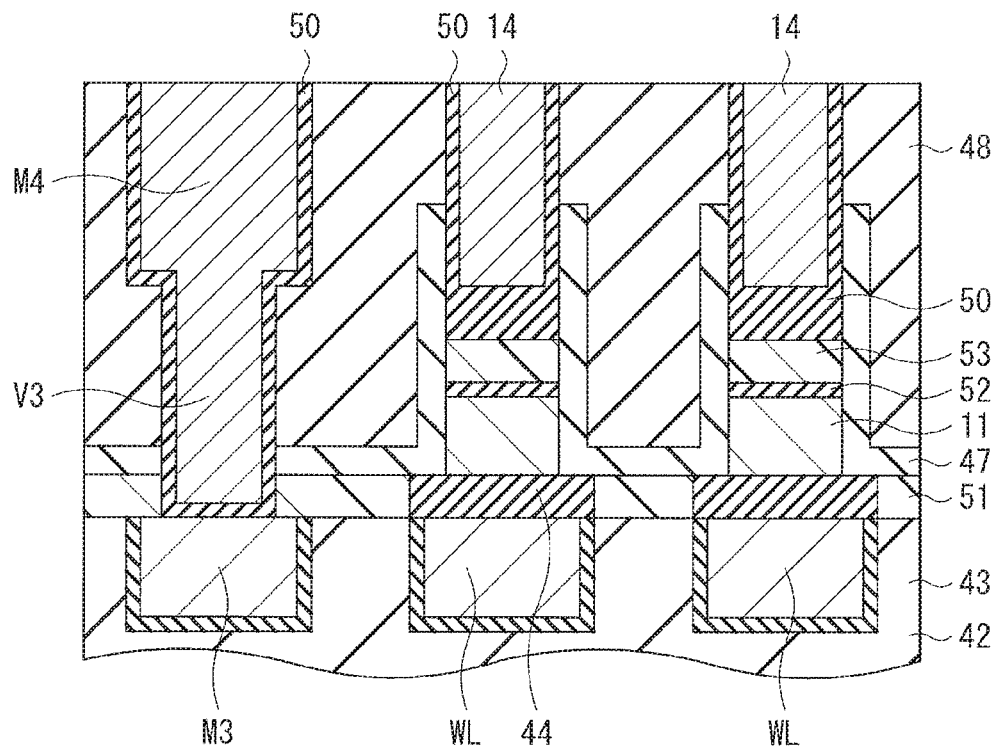

[ FIG. 11A ]
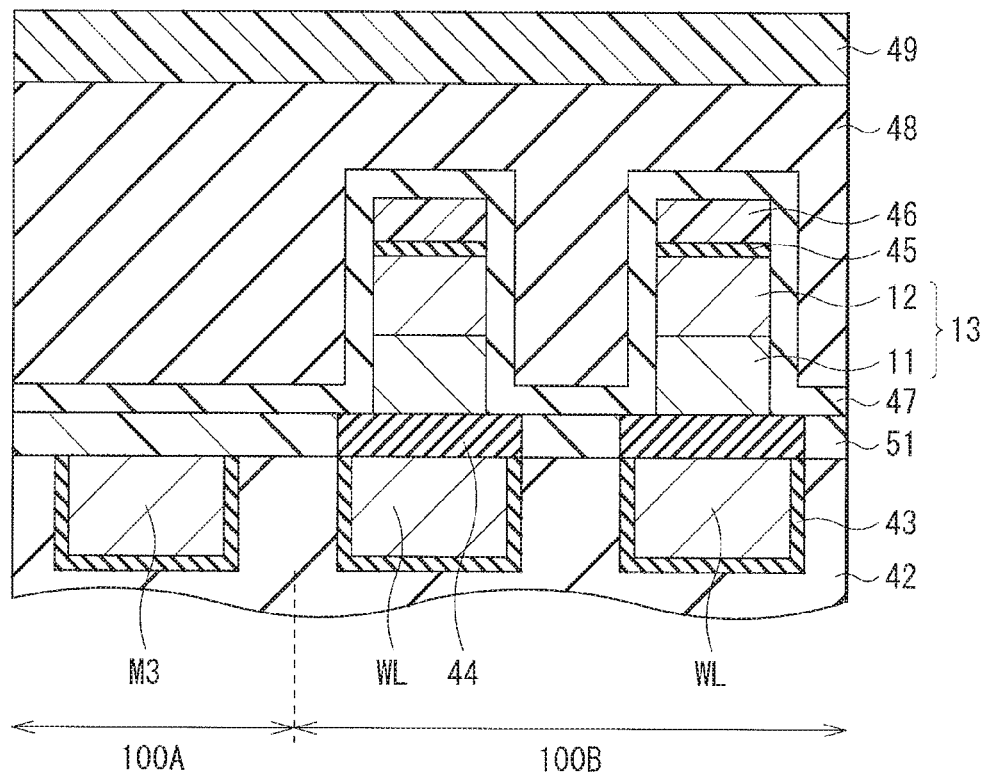
[ FIG. 11B ]
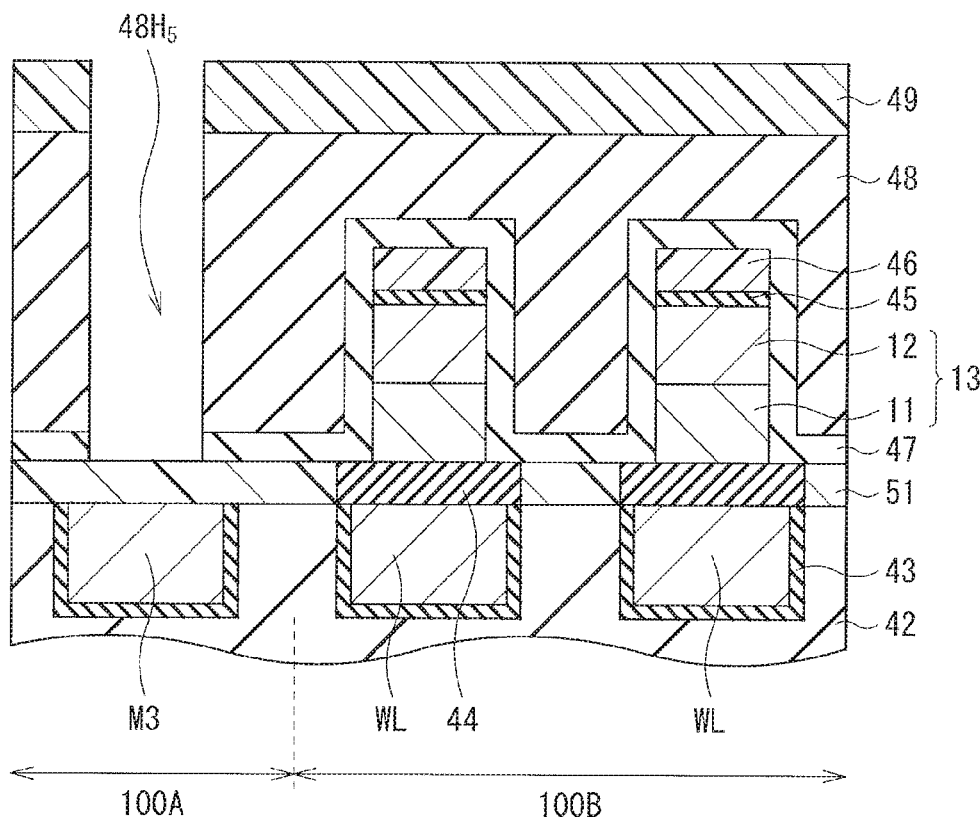

[ FIG. 11C ]
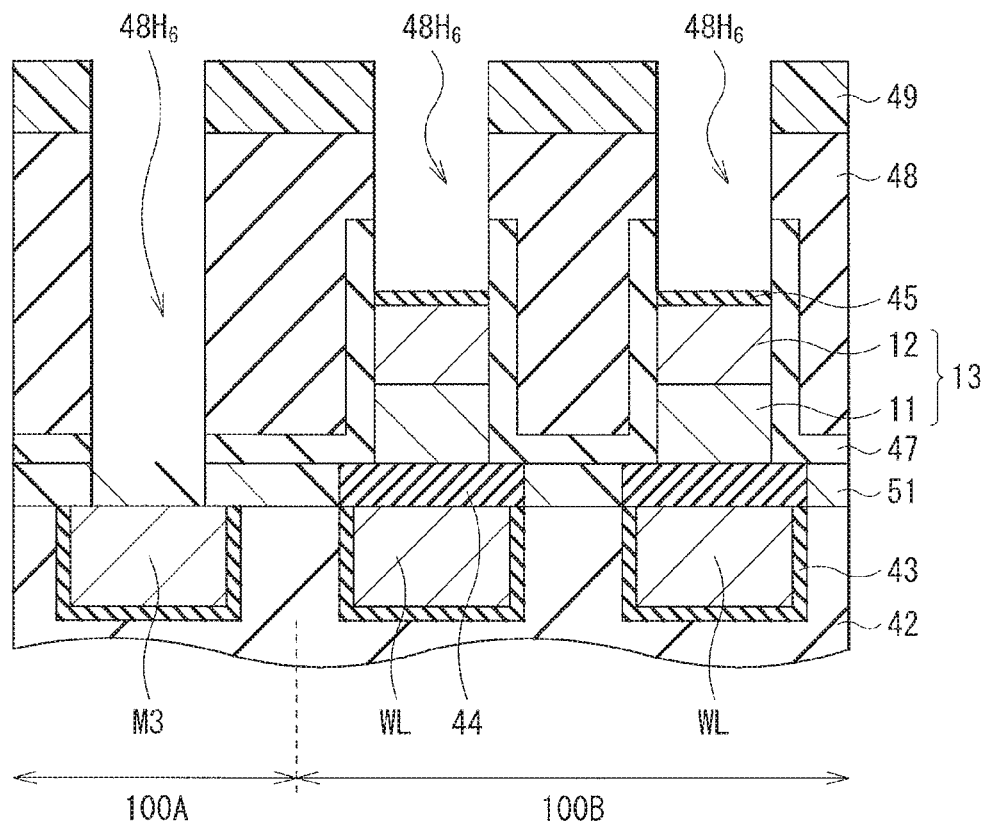
[ FIG. 11D ]
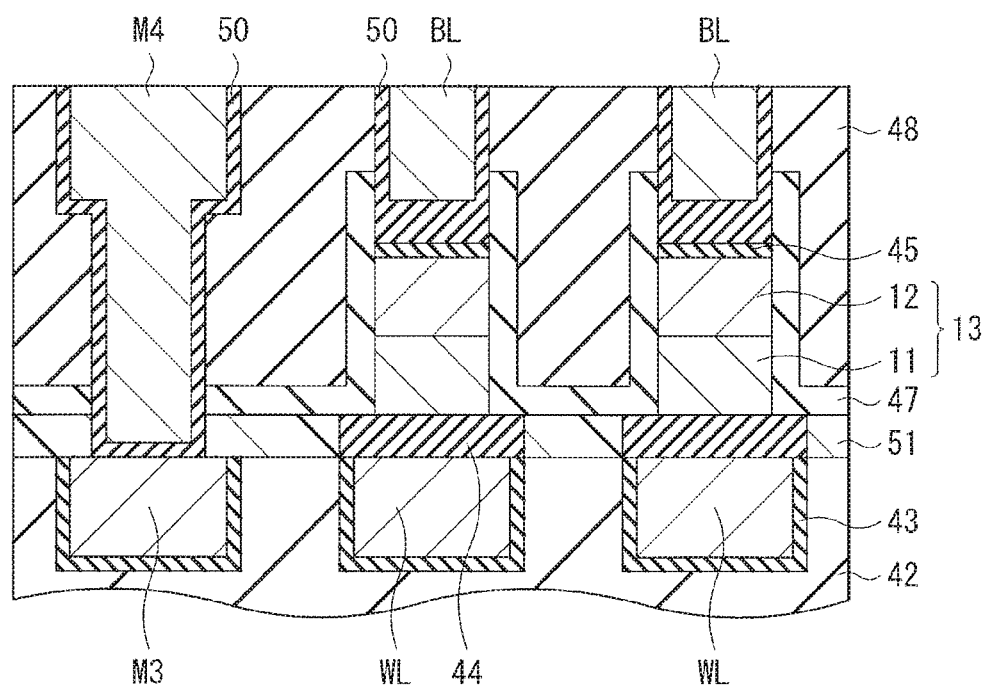

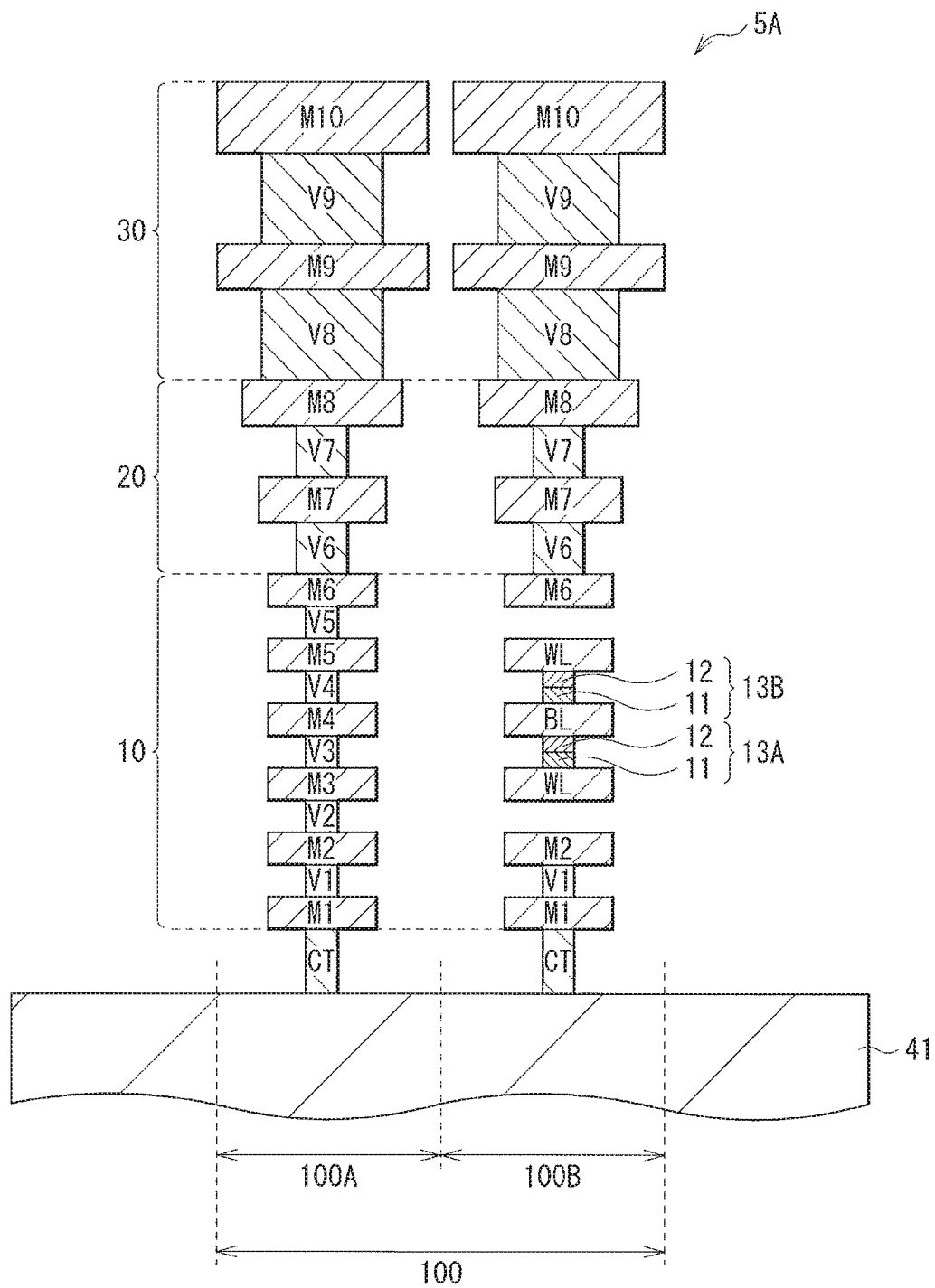
[FIG. 12]

[ FIG. 13 ]
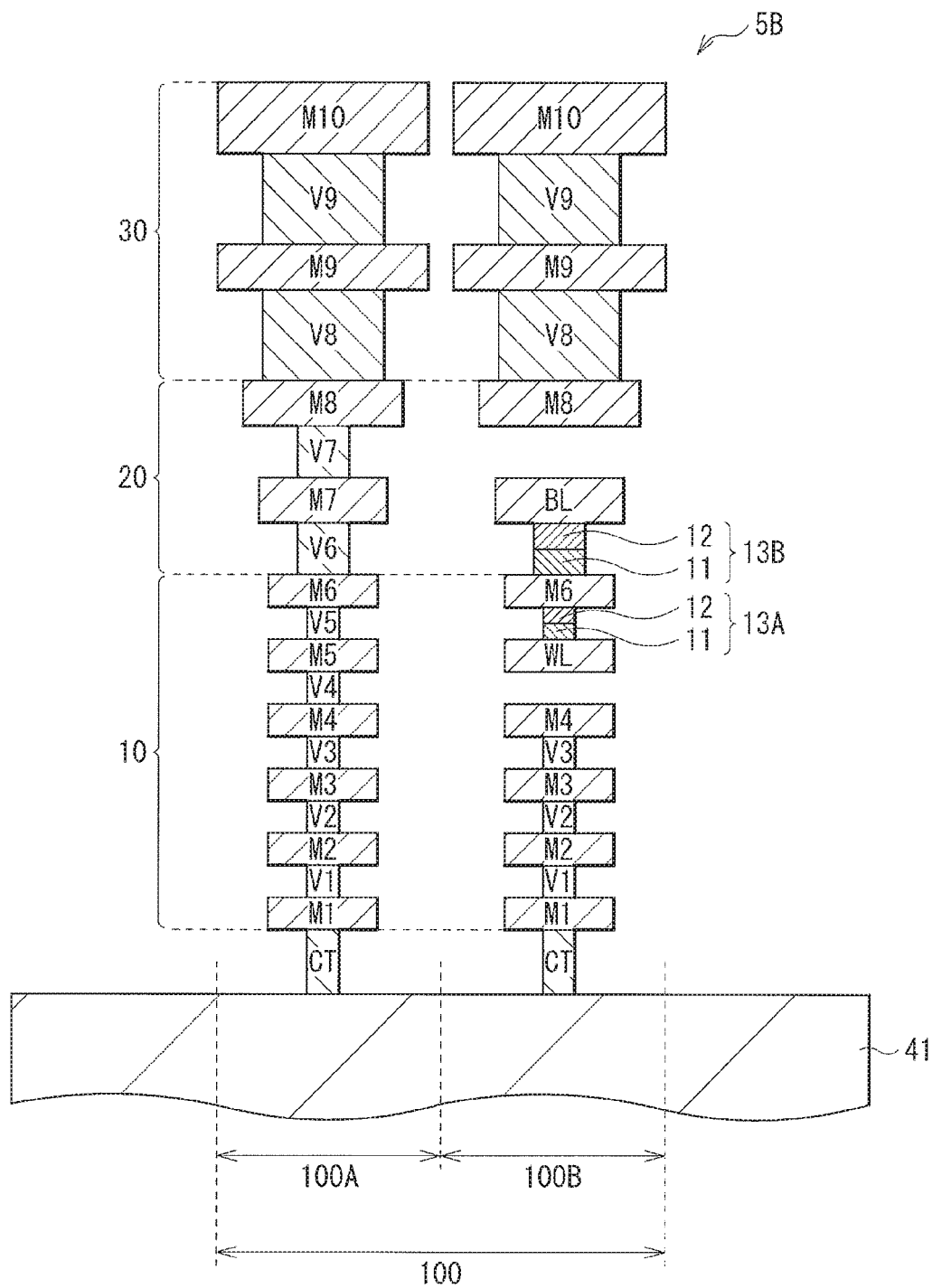

[ FIG. 14 ]
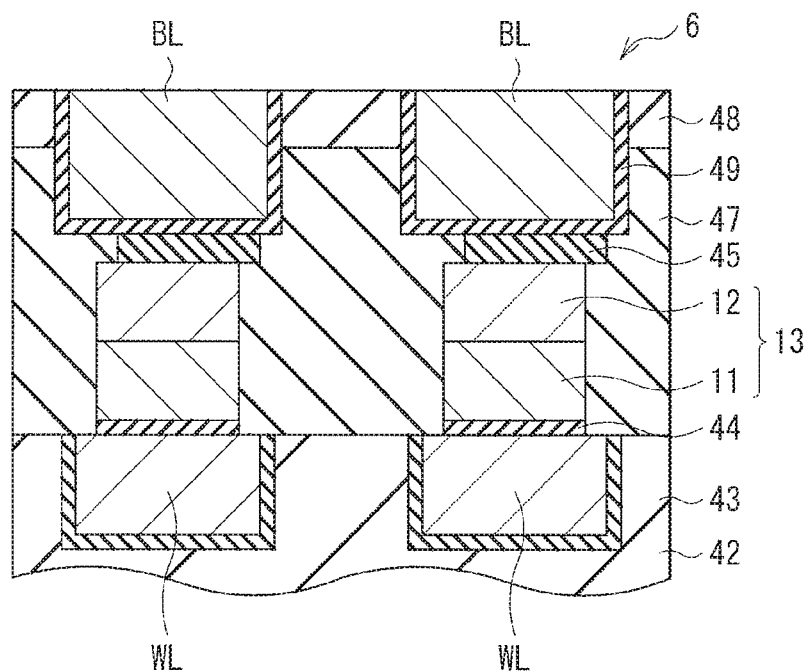
[ FIG. 15 ]
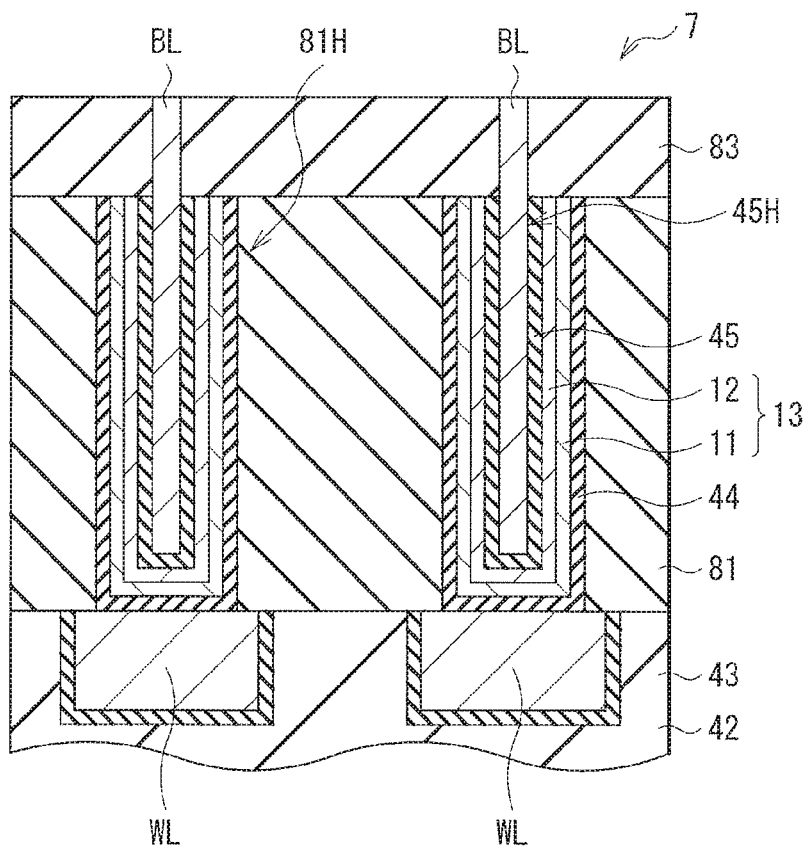

MEMORY DEVICE INCLUDING A MEMORY ELEMENT BETWEEN WIRING LAYERS AND METHOD OF MANUFACTURING MEMORY DEVICE

CROSS REFERENCE TO RELATED APPLICATIONS

This application is a U.S. National Phase of International Patent Application No. PCT/JP2018/017405 filed on May 1, 2018, which claims priority benefit of Japanese Patent Application No. JP 2017-107840 filed in the Japan Patent Office on May 31, 2017. Each of the above-referenced applications is hereby incorporated herein by reference in its entirety.

TECHNICAL FIELD

The present disclosure relates to a memory device in which a memory element is mixed on a logic circuit, and to a method of manufacturing the memory device.

BACKGROUND ART

For example, as in semiconductor devices disclosed in PTLs 1 and 2, mixed mounting of a non-volatile memory on a logic circuit of a semiconductor device such as a microcomputer has been used widely as a means of improving functional capabilities of the semiconductor device.

CITATION LIST

Patent Literature

PTL 1: Japanese Unexamined Patent Application Publication No. 2017-45947
PTL 1: Japanese Unexamined Patent Application Publication No. 2017-54900

SUMMARY OF THE INVENTION

Incidentally, in a case where a NOR-type flash memory is used as a memory to be mixed on a logic circuit, a memory section and a driver section are disposed in parallel to each other on a substrate. Therefore, an area per bit is likely to increase, which gives cause for concern about an increase in cost.

It is desirable to provide a memory device that makes it possible to achieve both of higher functional capabilities and cost reduction, and a method of manufacturing such a memory device.

A memory device according to an embodiment of the present disclosure includes: a logic circuit in which a plurality of wiring layers including layers that are different in wiring pitches is stacked; and a memory element that is provided between the plurality of wiring layers.

A method of manufacturing a memory device according to an embodiment of the present disclosure includes: forming a logic circuit by stacking a plurality of wiring layers including layers that are different in wiring pitches; and forming a memory element between the plurality of wiring layers.

In the memory device according to the embodiment of the present disclosure and the method of manufacturing the memory device according to the embodiment of the present disclosure, forming the memory element between the plurality of wiring layers including the layers that are different in the wiring pitches and configure the logic circuit allows the memory element to be mixed on the logic circuit without changing a wiring pattern or a stacked structure of the logic circuit.

According to the memory device of the embodiment of the present disclosure and the method of manufacturing the memory device of the embodiment of the present disclosure, the memory element is formed between the plurality of wiring layers including the wiring layers that are different in the wiring pitches and configure the logic circuit, which allows the memory element to be mixed on the logic circuit without changing the wiring pattern or the stacked structure of the logic circuit. This makes it possible to achieve both of higher functional capabilities and cost reduction.

It is to be noted that effects described above are not necessarily limitative, and any of effects described in the present disclosure may be provided.

BRIEF DESCRIPTION OF DRAWINGS

FIG. 1 is a cross-sectional schematic view of a configuration of a memory device according to a first embodiment of the present disclosure.
FIG. 2 is an enlarged cross-sectional schematic view of a main part of a memory section illustrated in FIG. 1.
FIG. 3A is a cross-sectional schematic view for describing an example of a method of manufacturing a main part of the memory device illustrated in FIG. 1.
FIG. 3B is a cross-sectional schematic view of a process subsequent to the process illustrated in FIG. 3A.
FIG. 3C is a cross-sectional schematic view of a process subsequent to the process illustrated in FIG. 3B.
FIG. 3D is a cross-sectional schematic view of a process subsequent to the process illustrated in FIG. 3C.
FIG. 3E is a cross-sectional schematic view of a process subsequent to the process illustrated in FIG. 3D.
FIG. 3F is a cross-sectional schematic view of a process subsequent to the process illustrated in FIG. 3E.
FIG. 3G is a cross-sectional schematic view of a process subsequent to the process illustrated in FIG. 3F.
FIG. 3H is a cross-sectional schematic view of a process subsequent to the process illustrated in FIG. 3G.
FIG. 4 is a cross-sectional schematic view of a configuration of a memory device according to a second embodiment of the present disclosure.
FIG. 5 is a cross-sectional schematic view of a configuration of a memory device according to a third embodiment of the present disclosure.
FIG. 6 is a cross-sectional schematic view of a configuration of a memory device according to a fourth embodiment of the present disclosure.
FIG. 7 is a cross-sectional schematic view of a configuration of a memory device according to a fifth embodiment of the present disclosure.
FIG. 8 is a cross-sectional configuration diagram of a configuration of a memory device according to Modification Example 1 of the present disclosure.
FIG. 9 is a cross-sectional schematic view of a configuration of a memory device according to Modification Example 2 of the present disclosure.
FIG. 10A is a cross-sectional schematic view for describing a method of manufacturing a main part of the memory device illustrated in FIG. 9.
FIG. 10B is a cross-sectional schematic view of a process subsequent to the process illustrated in FIG. 10A.
FIG. 10C is a cross-sectional schematic view of a process subsequent to the process illustrated in FIG. 10B.

FIG. 10D is a cross-sectional schematic view of a process subsequent to the process illustrated in FIG. 10C.

FIG. 10E is a cross-sectional schematic view of a process subsequent to the process illustrated in FIG. 10D.

FIG. 10F is a cross-sectional schematic view of a process subsequent to the process illustrated in FIG. 10E.

FIG. 10G is a cross-sectional schematic view of a process subsequent to the process illustrated in FIG. 10F.

FIG. 11A is a cross-sectional schematic view for describing a method of manufacturing a main part of a memory device according to Modification Example 3 of the present disclosure.

FIG. 11B is a cross-sectional schematic view of a process subsequent to the process illustrated in FIG. 11A.

FIG. 11C is a cross-sectional schematic view of a process subsequent to the process illustrated in FIG. 11B.

FIG. 11D is a cross-sectional schematic view of a process subsequent to the process illustrated in FIG. 11C.

FIG. 12 is a cross-sectional schematic view of a configuration of a memory device according to Modification Example 4 of the present disclosure.

FIG. 13 is a cross-sectional schematic view of a configuration of a memory device according to Modification Example 5 of the present disclosure.

FIG. 14 is a cross-sectional schematic view of a configuration of a main part of a memory device according to Modification Example 6 of the present disclosure.

FIG. 15 is a cross-sectional schematic view of a configuration of a main part of a memory device according to Modification Example 7 of the present disclosure.

MODES FOR CARRYING OUT THE INVENTION

Hereinafter, some embodiments of the present disclosure are described in detail with reference to the drawings. The following description is merely a specific example of the present disclosure, and the present disclosure is not limited to the following embodiments. Further, the present disclosure is not limited to arrangements, dimensions, dimensional ratios, etc. of each component illustrated in the drawings. It is to be noted that description is given in the following order.
1. First Embodiment (an example where a memory cell is disposed between wiring layers that configure a logic circuit)
   1-1. Configuration of Memory Device
   1-2. Method of Manufacturing Memory Device
   1-3. Workings and Effects
2. Second Embodiment (an example where, among three stacked wiring layers, a memory element is formed between the wiring layers on one side, and a selective element is disposed between the wiring layers on another side)
3. Third Embodiment (an example where a memory cell is formed among three stacked wiring layers, with a second-layer wiring layer being omitted)
4. Fourth Embodiment (an example where a memory cell and an intermediate resistive layer are formed in a stacked manner among three stacked wiring layers, with a second-layer wiring layer being omitted)
5. Fifth Embodiment (an example where a memory cell is so formed as to straddle a boundary between wiring layers that are different in wiring pitches)
6. Modification Examples
   6-1. Modification Example 1 (an example where a memory cell is formed among three stacked wiring layers including wiring layers that are different in wiring pitches, with a second-layer wiring layer being omitted)
   6-2. Modification Example 2 (an example where an intermediate resistive layer is provided between a memory element and a selective element that configure a memory cell)
   6-3. Modification Example 3 (an example where coupling of a wiring line and a via in a logic section and coupling of a bit line BL and a memory cell in a memory section are performed collectively by using etching stopper films that include different materials in the logic section and the memory section)
   6-4. Modification Example 4 (an example where a plurality of memory cells is provided between different wiring layers)
   6-5. Modification Example 5 (an example where a plurality of memory cells is provided between wiring layers that are different in wiring pitches)
   6-6. Modification Example 6 (an example where a position of a barrier metal film formed on a memory cell is shifted)
   6-7. Modification Example 7 (an example where a memory cell is formed using a damascene method between wiring layers that configure a logic circuit)

1. First Embodiment

FIG. 1 is a schematic view of a cross-sectional configuration of a memory device (a memory device 1) according to a first embodiment of the present disclosure. FIG. 2 is an enlarged view of a configuration of a main part of the memory device 1 illustrated in FIG. 1. The memory device 1 configures a microcomputer to be mounted on, for example, a mobile apparatus or an electronic apparatus of an automobile, etc., and has a configuration in which a memory is mixed on a logic circuit. In the present embodiment, the memory device 1 has a configuration in which a memory element 12 is formed between wiring layers (for example, between a metal film M3 and a metal film M4) out of a plurality of wiring layers (a metal film M1 to a metal film M10) that configure a logic circuit 100.

1-1. Configuration of Memory Device

As described above, the memory device 1 has a configuration in which a memory (the memory element 12) is mixed on the logic circuit 100, and the logic circuit 100 has a multi-layer wiring structure in which a plurality of wiring layers is stacked. The logic circuit 100 includes a logic section 100A in which a circuit is configured that performs logical operation, and a memory section 100B in which the memory element 12 is formed. The logic section 100A and the memory section 100B have the same wiring structure. In other words, the logic section 100A and the memory section 100B have identical wiring pattern in the same layer, and have the wiring structure of being formed at the same wiring interval in a stacking direction as well.

The multi-layer wiring structure configuring the logic circuit 100 has a configuration in which layers that are different in wiring pitches are stacked, and includes a layer (a first wiring layer) in which a plurality of wiring layers having dense wiring pitches is stacked, and a layer (a second wiring layer) in which a plurality of wiring layers having sparse wiring pitches is stacked. In the memory device 1 of the present embodiment, the logic circuit 100 has a configuration in which a first wiring layer 10 in which wiring layers having the densest wiring pitches are stacked, a second wiring layer 20 having the wiring pitches that are sparser than those of the first wiring layer 10, and a third wiring layer 30 having the sparsest wiring pitches are stacked in this order on a substrate 41, as illustrated in FIG. 1.

The multi-layer wiring structure configuring the logic circuit 100 has a structure in which, for example, ten-layer wiring layers are stacked. Specifically, the logic circuit 100 has a configuration in which, for example, the metal film M1, the metal film M2, the metal film M3, the metal film M4, the metal film M5, the metal film M6, the metal film M7, the metal film M8, the metal film M9, and the metal film M10 are formed to be embedded in an insulating film (for example, an interlayer insulating film 48 (see FIG. 3H)) in order from side of the substrate 41. The metal film M1 and the metal film M2 are coupled through a via V1. Hereinafter, in a similar manner, the metal film M2 and the metal film M3 are coupled through a via V2. The metal film M3 and the metal film M4 are coupled through a via V3. The metal film M4 and the metal film M5 are coupled through a via V4. The metal film M5 and the metal film M6 are coupled through a via V5. The metal film M6 and the metal film M7 are coupled through a via V6. The metal film M7 and the metal film M8 are coupled through a via V7. The metal film M8 and the metal film M9 are coupled through a via V8. The metal film M9 and the metal film M10 are coupled through a via V9. The metal film M1 is provided on the substrate 41 with a contact CT1 interposed in between. Out of the metal film M1 to the metal film M10 as described above, the metal film M1 to the metal film M6 are formed in accordance with the same wiring rule to configure the first wiring layer 10. The metal film M7 and the metal film M8 are formed in accordance with the same wiring rule to configure the second wiring layer 20. The metal film M9 and the metal film M10 are formed in accordance with the same wiring rule to configure the third wiring layer 30. It is to be noted that a configuration of the logic circuit 100 as illustrated in FIG. 1 is merely an example, and this is not limitative.

In the present embodiment, the memory element 12 configures a memory cell 13 along with a selective element 11, and is formed between the wiring layers of the memory section 100B having a wiring structure similar to that of the logic section 100A. Specifically, the memory element 12 is formed along with the selective element 11, as the memory cell 13, at a portion of the via V3, for example, between the metal film M3 and the metal film M4 in the first wiring layer 10 having the densest wiring pitches.

The memory cell 13 is an element that configures a memory cell array having a so-called cross-point array structure, and is provided at an intersection point of a word line WL extending in one direction and a bit line BL extending in a direction that is different from that of the word line WL. The present embodiment has a configuration in which the metal film M3 that is provided in the memory section 100B is used as the word line WL, while the metal film M4 is used as the bit line BL, and the selective element 11 is disposed on side of the word line WL, while the memory element 12 is disposed on side of the bit line BL. It is to be noted that FIG. 1 does not illustrate the vias V2 and V5 that perform coupling between the metal film M2 and the word line WL and between the metal film M5 and the metal film M6 respectively; however, each electrical coupling is performed at a position that is different from a cross-sectional surface illustrated in FIG. 1.

(Selective Element)

The selective element 11 serves to selectively operate any one of a plurality of memory elements provided in the memory cell array having the so-called cross-point array structure. Further, the selective element 11 is coupled to the memory element 12 in series, and causes a significant decrease in a resistance with an increase in an applied voltage, while exhibiting a high-resistance state in a case where the applied voltage is low. In other words, the selective element 11 has non-linear electrical resistance characteristics that exhibit high electrical resistance in a case where the applied voltage is low, and a significant decrease in the electrical resistance in a case where the applied voltage is high to cause flow of a large current (for example, a current that is higher by a factor of several orders of magnitude). Further, the selective element 11 is an element that performs no memory operation such as an operation that maintains a conduction path to be formed by ion migration caused by the applied voltage even after elimination of the applied voltage, for example.

The selective element 11 has a configuration using, for example, an ovonic threshold switch, and includes an elemental configuration of any of, for example, BGaPTe, BGaAsTe, BGaPTeN, BGaAsTeN, BGaPTeO, BGaAsTeO, BGaCPTe, BGaCAsTe, BGaCPTeN, BGaCAsTeN, BGaCPTeO, and BGaCAsTeO. Further, the selective element 11 may be configured using, for example, an MSM (Metal-Semiconductor-Metal) diode, an MIM (Metal-Insulator-Metal) diode, and a varistor, or may include a plurality of layers. In addition, as the selective element 11, a unidirectional diode or a bidirectional diode may be used depending on an operation method of the memory element 12.

(Memory Element)

The memory element 12 is a resistive random access memory element having non-volatility that allows for holding a state where a resistance value is varied reversibly by an electrical signal, for example. The memory element 12 has, for example, a structure in which an ion source layer 12A and a resistance change layer 12B are stacked, as illustrated in FIG. 2.

The ion source layer 12A is formed to include mobile elements that form a conduction path in the resistance change layer 12B through application of an electrical field. These mobile elements are, for example, a transition metal element, aluminum (Al), copper (Cu), or a chalcogen element. Examples of the chalcogen element include tellurium (Te), selenium (Se), and sulfur (S). The transition metal element is an element belonging to any of the fourth to sixth groups of the periodic table, and examples of such a transition metal element include titanium (Ti), zirconium (Zr), hafnium (Hf), vanadium (V), niobium (Nb), tantalum (Ta), chromium (Cr), molybdenum (Mo), tungsten (W), and the like. The ion source layer 12A includes one or two or more of the above-described mobile elements. Alternatively, the ion source layer 12A may include oxygen (O), nitrogen (N), an element other than the above-described mobile elements (for example, manganese (Mn), cobalt (Co), iron (Fe), nickel (Ni), platinum (Pt)), silicon (Si), or the like.

The resistance change layer 12B includes, for example, an oxide of a metal element or a non-metal element, or a nitride of the metal element or the non-metal element, and has a resistance value that is changed in a case where a predetermined voltage is applied between a pair of electrodes.

In the memory element 12 of the present embodiment, when a voltage or current pulse in a "positive direction" is applied to an element that is in an initial state (a high-resistance state), for example, the transition metal element included in the ion source layer 12A is ionized to diffuse into the resistance change layer 12B, or oxygen ion migrates, which causes an oxygen deficiency. As a result, a low-resistance part (the conduction path) that is in a low oxidation state is formed in the resistance change layer 12B to lower a resistance in the resistance change layer 12B (a recording state). When a voltage pulse in a "negative direction" is applied to the memory element 12 that is in such a low-resistance state, metal ion in the resistance change layer 12B migrates into the ion source layer 12A, or the oxygen ion migrates from the ion source layer 12A to decrease the oxygen deficiency in a conduction path part. This results in disappearance of the conduction path including the transition metal element, which puts the resistance change layer 12B in a high-resistance state (an initial state or an erasure state).

It is to be noted that fundamentals of the resistance change are not specifically limited to a change of phase, polarization, a magnetization direction, formation of the conduction path (a filament), etc. In other words, as the memory element 12, any of, for example, a PCM (a phase-change memory element), an FeRAM (a ferroelectric random access memory element), an MRAM (a magnetoresistive random access memory element), and a resistive random access memory element that includes a transition metal oxide or a chalcogenide may be used.

Further, in the memory cell 13 illustrated in FIG. 2, an example where the ion source layer 12A is disposed on the side of the bit line BL, and the resistance change layer 12B is disposed on side of the selective element 11 is illustrated; however, this is not limitative. As a configuration of the memory element 12, the ion source layer 12A may be disposed on the side of the selective element 11, and the resistance change layer 12B may be disposed on the side of the bit line BL. In addition, the memory cell 13 may include another layer. For example, a barrier layer that prevents, for example, diffusion of the transition metal elements and ion conduction may be formed between the selective element 11 and the memory element 12. Examples of a material for the barrier layer include tungsten (W), tungsten nitride (WN), titanium nitride (TiN), carbon (C), molybdenum (Mo), tantalum (Ta), tantalum nitride (TaN), titanium tungsten (TiW), and silicide, etc. Providing the barrier layer reduces degradation in the selective element 11 that is caused by diffusion of the transition metal elements included in the ion source layer 12A.

1-2. Method of Manufacturing Memory Device

It is possible to manufacture the memory device 1 of the present embodiment in the following manner, for example. It is to be noted that a manufacturing method described below is merely an example, and the memory device 1 may be formed using any other method.

FIGS. 3A, 3B, 3C, 3D, 3E, 3F, 3G, and 3H illustrate a method of manufacturing a main part (wiring layers between which the memory cell 13 is formed) of the memory device 1 of the present embodiment in the order of processes. First, as illustrated in FIG. 3A, for example, a wiring technique based on a typical damascene method is used to form the metal film M5 and the word line WL having the same wiring pattern as the metal film M5, each of which has a barrier metal film 43 at the periphery thereof, and are embedded in the interlayer insulating layer 42. It is to be noted that, in the present embodiment, the metal films M1 to M10, the word line WL, the bit line BL, and the vias V1 to V9 include copper (Cu), and a barrier metal film (for example, the barrier metal film 43) that prevent diffusion of Cu are formed at the periphery thereof. Thereafter, a continuous barrier metal film (for example, a TiN film) 44, a selective element layer 11X, a memory element layer 12X, a barrier metal film (for example, a TiN film) 45, and a hard mask (a mask 46) are formed in this order on the metal film M5, the word line WL, and the interlayer insulating layer 42 using, for example, a PVD (Physical Vapor Deposition) method and a CVD (Chemical Vapor Deposition) method.

Next, as illustrated in FIG. 3B, the mask 46 is patterned using, for example, a photolithographic method, and thereafter the barrier metal film 44, the selective element layer 11X, the memory element layer 12X, and the barrier metal film 45 are etched using, for example, a dry etching method to form the memory cell 13 on the word line WL.

Subsequently, as illustrated in FIG. 3C, an SiN film 47 is formed using, for example, an ALD method or the CVD method. This ensures that an etching stopper film 47a and a protective film 47b that protects the memory cell 13 are formed in a single process.

Next, as illustrated in FIG. 3D, a Low-K film is formed on the SiN film 47 using, for example, the CVD method, and thereafter a surface thereof is planarized using a CMP (Chemical Mechanical Polishing) method to form an interlayer insulating layer 48. Subsequently, a hard mask (a mask 49) is formed on the interlayer insulating layer 48.

Next, the via V3 and the metal film M4 are formed on the logic section 100A and the bit line BL is formed on the memory section 100B, by using a damascene method. First, as illustrated in FIG. 3E, the mask 49 is patterned using the photolithographic method, and an opening $48H_1$ reaching the etching stopper film 47a is formed through, for example, etching on the metal film M3 provided in the logic section 100A.

Next, as illustrated in FIG. 3F, the mask 49 is patterned using, for example, the photolithographic method, and thereafter openings $48H_2$ having opening widths of the metal film M4 and the bit line BL are formed through etching respectively on the metal film M3 and the memory cell 13.

Subsequently, as illustrated in FIG. 3G, by performing etching once again, the mask 46 on the memory cell 13 is removed, and the etching stopper film 47a on the metal film M3 is also etched to expose the metal film M3.

Next, for example, a TiN film is formed as a barrier metal film 50 within the opening $48H_2$, for example, on a side surface and a bottom surface of the opening $48H_2$. Finally, a copper (Cu) film is formed in the opening $48H_2$ as the via V3, the metal film M4, and the bit line BL, and thereafter a copper film formed on the interlayer insulating layer 48 is polished to be removed in the CMP method, thereby planarizing the surface. This ensures to form the wiring layers (here, the metal film M3 and the metal film M4) with the memory cell 13 incorporated in the memory section 100B.

1-3. Workings and Effects

As described previously, mixed mounting of a non-volatile memory on a logic circuit that configures a semiconductor device such as a microcomputer has been used widely as a means of improving functional capabilities of the semiconductor device. As the non-volatile memory to be mixed on the logic circuit, a NOR-type flash memory, a slip-gate type flash memory, and the like are typically used.

These flash memories are memories that apply semiconductor transistors, thus making it necessary to dispose a memory section and a driver section in parallel to each other on a substrate. Therefore, an area per bit is likely to increase, which has raised an issue of an increase in cost.

In contrast, in the memory device 1 and the manufacturing method thereof of the present embodiment, the memory element 12 is provided between the plurality of wiring layers that configure the logic circuit 100. This allows for mixed mounting of the memory element 12 on the logic circuit 100 without disposing the memory section and the driver section in parallel to each other on the substrate 41 as described above.

Taking all of this into account, in the memory device 1 and the manufacturing method thereof of the present embodiment, the memory element 12 is provided between the plurality of wiring layers that configure the logic circuit 100. This allows for mixed mounting of the memory element 12 on the logic circuit 100 without disposing the memory section and the driver section in parallel to each other on the substrate 41 as described above, which makes it possible to achieve both of higher functional capabilities and cost reduction.

Further, in the present embodiment, a resistive random access non-volatile memory element is used as the memory element 12. This makes it possible to form the memory element 12 between the metal films (for example, between the metal film M3 and the metal film M4) that configure the first wiring layer 10 having the densest wiring pitches among the wiring layers that configure the logic circuit, without changing the wiring pattern or the stacked structure of the wiring layers that configure the logic circuit. Specifically, it is possible to form the memory element 12 by simply replacing the via V3 that couples the metal film M3 and the metal film M4 in the logic section 100A with the memory cell 13. This makes it possible to provide the memory device 1 with higher functional capabilities at low cost.

Further, as described above, in a case where the dry etching method is used in a process of forming the memory cell 13, damage takes place on a side surface of the memory cell 13. Therefore, it is preferable to form a protective film on the side surface of the memory cell 13; however, this gives cause for concern about an increase in the number of the processes. In contrast, in the method of manufacturing the memory device 1 of the present embodiment, the protective film 57b that protects the sidewall of the memory cell 13 is formed collectively in the same process as that of forming the etching stopper film 47a to be used in forming the via V3 that performs coupling between wiring lines provided in the logic section (for example, between the metal film M3 and the metal film M4). This makes it possible to form the protective film 47b of the memory cell 13 without increasing the number of the processes.

Next, description is given of second to fifth embodiments as well as Modification Examples 1 to 7. Hereinafter, components similar to those of the above-described first embodiment are denoted with the same reference numerals, and descriptions thereof are omitted as appropriate.

2. Second Embodiment

FIG. 4 is a schematic view of a cross-sectional configuration of a memory device (a memory device 2A) according to a second embodiment of the present disclosure. The present embodiment differs from the above-described first embodiment in that the selective element 11 and the memory element 12 that configure the memory cell 13 are provided separately among three wiring layers (for example, between the metal film M3 and the metal film M4 and between the metal film M4 and the metal film M5, respectively) that are formed in a stacked manner in the first wiring layer 10 that configures the logic circuit 100.

As described above, in the memory device 2A of the present embodiment, the selective element 11 and the memory element 12 are provided respectively between the metal film M3 and the metal film M4 and between the metal film M4 and the metal film M5, with the metal film M4 that configures the first wiring layer 10 in between. In other words, the via V3 that couples the metal film M3 and the metal film M4, and the via V4 that couples the metal film M4 and the metal film M5 in the logic section 100A are replaced with the selective element 11 and the memory element 12, respectively. As compared with the above-described first embodiment, this allows the selective element 11 and the memory element 12 to adequately secure respective thicknesses in a stacking direction. Therefore, in addition to the above-described first embodiment, the present embodiment achieves an effect that makes it possible to maintain respective performances when microfabrication of the logic circuit 100 makes progress.

3. Third Embodiment

FIG. 5 is a schematic view of a cross-sectional configuration of a memory device (a memory device 3A) according to a third embodiment of the present disclosure. The present embodiment differs from the above-described first and second embodiments in that, of the first wiring layer 10 that configures the logic circuit 100, for example, the metal film M4 is omitted, and the memory cell 13 including the selective element 11 and the memory element 12 is provided between the metal film M3 and the metal film M5.

It is possible to form the selective element 11 and the memory element 12 in the memory device 3A of the present embodiment by using, for example, the processes of forming the via V3 and the metal film M4 as described in the above-described first embodiment. In other words, for example, in the processes of forming the via V3 and the metal film M4 in the logic section 100A as illustrated in FIG. 3E to FIG. 3H, the similar opening 48H$_2$ is formed also in the memory section 100B, and a material of the selective element 11 is used in place of copper (Cu) used for configuring the via V3 and the metal film M4. In such a manner, it is possible to form the selective element 11 illustrated in FIG. 5. As for the memory element 12, in the processes of forming the via V4 and the metal film M5 in the logic section 100A, an opening is formed using a similar method, and the opening is filled with a material of the memory element 12. In such a manner, it is possible to form the memory element 12 illustrated in FIG. 5.

As a method other than that described above, a method given below is available. For example, the selective element 11 is formed in the dry etching method, and thereafter the via V3 and the metal film M4 are formed on the metal film M3 of the logic section 100A. It is to be noted that, at this time, no patterning of the metal film M4 is performed on the selective element 11 that is provided in the memory section 100B. Such a process ensures that a top surface of the selective element 11 and a top surface of the metal film M4 are in the same plane. Subsequently, the memory element 12 is formed on the selective element 11 in the dry etching method, and thereafter the via V4 and the metal film M5 are formed at the same time in both of the logic section 100A and the memory section 100B.

As described above, in the memory device 3A of the present embodiment, in the memory section 100B, the metal film M4 that configures the first wiring layer 10 is omitted, and the memory cell 13 is provided between the metal film M3 and the metal film M5. This allows the selective element 11 and the memory element 12 to further secure the respective thicknesses corresponding to a thickness of the metal film M4 in the stacking direction. Therefore, as compared with the above-described second embodiment, the present embodiment achieves an effect that makes it possible to maintain a higher performance even when microfabrication of the logic circuit 100 makes progress.

4. Fourth Embodiment

FIG. 6 is a schematic view of a cross-sectional configuration of a memory device (a memory device 4A) according to a fourth embodiment of the present disclosure. The present embodiment differs from the above-described first to third embodiments in that, of the first wiring layer 10 that configures the logic circuit 100, for example, the metal film M4 is omitted; the memory cell 13 including the selective element 11 and the memory element 12 is provided at a position where the via V3 and the metal film M4 are formed; and an intermediate resistive layer 14 is formed at a position where the via V4 is formed.

The intermediate resistive layer 14 serves to prevent an unintended charge current from flowing through the memory cell 13. The intermediate resistive layer 14 has, for example, a configuration similar to that of the via V4 to be provided in the logic section 100A, and it is possible to form the intermediate resistive layer 14 upon formation of the via V4 of the logic section 100A, for example. As an alternative, the intermediate resistive layer 14 may be formed collectively along with the memory element 12 in the dry etching method in forming the memory element 12, in a state where a film that configures the intermediate resistive layer 14 is formed on the memory element 12.

As described above, in the memory device 4A of the present embodiment, in the memory section 100B, the metal film M4 that configures the first wiring layer 10 is omitted; the memory cell 13 is provided at the position where the via V3 and the metal film M4 are formed; and the intermediate resistive layer 14 is formed on the memory cell 13. This makes it possible to prevent degradation in the memory cell 13 that is caused by the unintended charge current possibly flowing through the memory cell 13, while securing thicknesses of the selective element 11 and the memory element 12 in the stacking direction. Therefore, in addition to the effect of the above-described first embodiment, the present embodiment achieves an effect that makes it possible to maintain respective performances when microfabrication of the logic circuit 100 makes progress, as well as an effect that allows for enhancement in operational stability of the memory cell 13.

Further, formation of the intermediate resistive layer 14 typically involves an increase in the number of processes, leading to an increase in costs. In contrast, in the present embodiment, the via V4 that couples the metal film M4 and the metal film M5 in the logic section 100A is used as the intermediate resistive layer 14 in the memory section 100B. This allows the intermediate resistive layer 14 to be formed without increasing the number of the processes.

5. Fifth Embodiment

FIG. 7 is a schematic view of a cross-sectional configuration of a memory device (a memory device 2B) according to a fifth embodiment of the present disclosure. The present embodiment differs from the above-described first to fourth embodiments in that the selective element 11 and the memory element 12 that configure the memory cell 13 are so formed as to straddle the first wiring layer 10 and the second wiring layer 20 that configure the logic circuit 100.

As described above, in the memory device 2B of the present embodiment, the selective element 11 and the memory element 12 that configure the memory cell 13 are so formed as to straddle the first wiring layer 10 and the second wiring layer 20 that configure the logic circuit 100. Specifically, for example, the selective element 11 is disposed between the metal film M6 that configures the first wiring layer 10 and is provided at a boundary with respect to the second wiring layer 20 and the metal film M5 located directly beneath the metal film M6, and the memory element 12 is formed between the metal film M6 and the metal film M7 that configures the second wiring layer 20. This allows the selective element 11 and the memory element 12 to adequately secure respective thicknesses in the stacking direction. Further, the memory element 12 is provided in the second wiring layer 20 having sparser wiring pitches than the first wiring layer 10. The vias V6 and V7 that are provided in the second wiring layer 20 are greater, in a wiring width, than the vias V1 to V5 that are provided in the first wiring layer 10. Consequently, replacement of the via of the second wiring layer 20 (here, the via V6) with the memory element 12 makes it possible to secure an element area of the memory element 12. Therefore, as compared with the above-described second embodiment, the present embodiment achieves an effect that makes it possible to maintain the performance of the memory element 12 even when microfabrication of the logic circuit 100 further makes progress.

Further, in the present embodiment, the metal film M7 that configures the second wiring layer 20 having a large wiring width and a film thickness in the stacking direction is used as the bit line BL, which allows for lowering of a resistance of the bit line BL. This suppresses deterioration in signals, thus enabling an effect that makes it possible to enhance the performance of the memory element 12.

6. Modification Examples

6-1. Modification Example 1

FIG. 8 is a schematic view of a cross-sectional configuration of a memory device (a memory device 3B) according to Modification Example 1 of the present disclosure. The memory device 3B of the present modification example is a combination of the configurations of the above-described third embodiment and the above-described fifth embodiment. The memory cell 13 is so formed as to straddle the first wiring layer 10 and the second wiring layer 20, and the selective element 11 and the memory element 12 are stacked between the metal film M5 and the metal film M7, with the metal film M6 being omitted.

With the configuration described above, the memory device 3B of the present modification example achieves an effect that makes it possible to maintain the performance of the memory element 12 even when microfabrication of the logic circuit 100 further makes progress.

6-2. Modification Example 2

FIG. 9 is a schematic view of a cross-sectional configuration of a memory device (a memory device 4B) according to Modification Example 2 of the present disclosure. In the memory device 4B of the present modification example, the intermediate resistive layer 14 that is provided between the memory cell 13 and the bit line BL in the above-described fourth embodiment is provided between the selective element 11 and the memory element 12.

It is possible to manufacture the memory device 4B of the present modification example in the following manner, for example.

FIGS. 10A, 10B, 10C, 10D, 10E, 10F, and 10G illustrate a method of manufacturing a wiring layer in which the memory cell 13 of the memory device 4B is formed in the order of processes. First, as illustrated in FIG. 10A, for example, a barrier film 51 that includes, for example, titanium nitride (TiN) or tungsten (W) is formed on the metal film M3 and the word line WL having the same wiring pattern as the metal film M3, each of which has the barrier metal film 43 at the periphery thereof and is formed using a wiring technique based on the typical damascene method, as well as on the interlayer insulating layer 42.

Subsequently, as illustrated in FIG. 10B, a barrier metal film 44 is formed at a position corresponding to the word line WL inside the barrier film 51 using, for example, the PVD method, the CVD method, and the CMP method. Next, as illustrated in FIG. 10C, the selective element layer 11X, a barrier metal film (for example, a TiN film) 52, and hard masks (masks 53 and 54) are formed in this order on the barrier film 51 and the barrier metal film 44 using, for example, the PVD method and the CVD method.

Next, as illustrated in FIG. 10D, the mask 54 is patterned using, for example, the photolithographic method, and thereafter the selective element layer 11X, the barrier metal film 52, and the mask 53 are etched to form the memory cell 13 on the word line WL. Subsequently, the SiN film 47 is formed on the barrier film 51, as well as on a side surface and a top surface of the stacked selective element 11, barrier metal film 52 and masks 53 and 54 using, for example, the ALD method or the CVD method. Next, a Low-K film is formed on the SiN film 47 using, for example, the CVD method, and thereafter the surface is planarized in the CMP method to form the interlayer insulating layer 48. Thereafter, the hard mask (the mask 49) is formed on the interlayer insulating layer 48.

Subsequently, by using the damascene method, the via V3 and the metal film M4 are formed in the logic section 100A, and the bit line BL is formed in the memory section 100B. First, as illustrated in FIG. 10E, the mask 49 is patterned using the photolithographic method, and an opening $48H_3$ is formed through, for example, etching on each of the metal film M3 that is provided in the logic section 100A and the selective element 11. At this time, the barrier film 51 and the mask 53 serve as etching stopper films on the metal film M3 and the selective element 11, respectively.

Next, as illustrated in FIG. 10F, the mask 49 is patterned using, for example, the photolithographic method, and thereafter an opening $48H_4$ of the metal film M4 is formed on the metal film M3 through etching. Thereafter, by performing etching once again, the barrier film 51 on the metal film M3 and the mask 53 on the selective element 11 are removed.

Next, as illustrated in FIG. 10G, a barrier metal film 50 is formed inside the opening $48H_4$ using, for example, the PVD method. At this time, a film thickness of the barrier metal film 50 to be formed varies with a depth of the opening $48H_4$. In other words, as illustrated in FIG. 10G, the barrier metal film 50 is formed more thickly at the bottom of the opening $48H_4$ on the selective element 11 having smaller depth of the opening $48H_4$ than a case where the barrier metal film 50 is formed on the metal film M3. The barrier metal film 50 that is provided on the selective element 11 corresponds to the intermediate resistive layer 14. The barrier metal film 50 is, for example, a TiN film, and has a higher resistance than copper (Cu) used for configuring the via V3. By utilizing a difference in the depth of the opening $48H_4$, the barrier metal film 50 is formed as a thick film on the selective element 11, and such a barrier metal film 50 is used as the intermediate resistive layer 14 along with the via V3 to be formed on the selective element 11. This makes it possible to adjust a resistance value of the intermediate resistive layer 14 to a desired value.

Subsequently, a copper (Cu) film serving as the via V3 and the metal film M4 is formed inside the opening $48H_4$, and thereafter a copper film that is formed on the interlayer insulating layer 48 is polished in the CMP method to be removed, thereby planarizing the surface. Thereafter, by using the above-described method of manufacturing the via V3, the metal film M4, and the memory cell 13, the via V4 and the memory element 12 are formed. In such a manner, a wiring layer in which the selective element 11 and the memory element 12 are stacked with the via V3 in between is formed between the metal film M3 and the metal film M5 illustrated in FIG. 9.

As described above, the intermediate resistive layer 14 may be provided between the selective element 11 and the memory element 12. Further, in the present modification example, in the manufacturing processes thereof, it is possible to adjust the resistance value of the intermediate resistive layer 14 to a desired value by adjusting a thickness of the barrier metal film 50 to be formed on the selective element 11 utilizing a difference in the depth of the opening $48H_4$.

6-3. Modification Example 3

FIGS. 11A, 11B, 11C, and 11D illustrate another example of the method of manufacturing a wiring layer in which the memory cell 13 of a memory device (the memory device 1) according to Modification Example 3 of the present disclosure is formed, in the order of processes.

In the present modification example, as illustrated in FIG. 11A, as with Modification Example 2, the barrier film 51 is first formed on the metal film M3 and the word line WL having the same wiring pattern as the metal film M3, each of which has the barrier metal film 43 at the periphery thereof, as well as on the interlayer insulating layer 42, and thereafter the barrier metal film 44 is formed at a position corresponding to the word line WL inside the barrier film 51. Subsequently, the selective element layer 11X, the memory element layer 12X, the barrier metal film 45, and a hard mask (the mask 46) are formed in this order on the barrier film 51 and the barrier metal film 44.

Next, the selective element layer 11X, the memory element layer 12X, and the barrier metal film 45 are etched using the photolithographic method and the dry etching method to form the memory cell 13 on the word line WL. Subsequently, the SiN film 47 is formed on the barrier film 51, as well as on a side surface and a top surface of the stacked selective element layer 11X, memory element layer 12X, barrier metal film 45, and mask 46. Next, the Low-K film is formed on the SiN film 47 using, for example, the CVD method, and thereafter the surface is planarized in the CMP method to form the interlayer insulating layer 48.

Subsequently, by using the damascene method, the via V3 and the metal film M4 are formed in the logic section 100A, and the bit line BL is formed in the memory section 100B. First, as illustrated in FIG. 11B, the mask 49 is patterned using the photolithographic method, and an openings $48H_5$ that reaches the barrier film 51 is formed on the metal film M3 that is provided in the logic section 100A.

Next, as illustrated in FIG. 11C, the mask 49 is first patterned using the photolithographic method, and thereafter an opening 48H₆ is formed through etching on each of the metal film M3 and the memory cell 13. Subsequently, by performing etching once again, the barrier film 51 on the metal film M3 and the mask 46 on the memory cell 13 are etched together. This results in exposure of the metal film M3 and the barrier metal film 45 that is provided on the memory cell 13.

Finally, as illustrated in FIG. 11D, after the barrier metal film 50 is formed on a side surface and a bottom surface of the opening 48H₆, a copper (Cu) film serving as the via V3 and the metal film M4 is embedded in the opening 48H₆, and a copper film that is formed on the interlayer insulating layer 48 is polished in the CMP method to be removed, thereby planarizing the surface.

In the manufacturing method described in the above-described first embodiment, a process of providing openings for coupling of the metal film M3 and the via V3 in the logic section 100A and for coupling of the memory cell 13 (specifically, the barrier metal film 45 that is provided on the memory cell 13) and the bit line BL in the memory section 100B has difficulty in forming such openings at the same time due to difference in etching materials or respective film thicknesses.

In contrast, in the present modification example, a film (the barrier film 51) that ensures the etching-resistant property identical to that of the mask 46 that is formed on the memory cell 13 is disposed in advance on the metal film M3 of the logic section 100A. This makes it possible to extend a margin in the process of forming the opening 48H₆, which allows for enhancement in manufacturing yield.

6-4. Modification Example 4

FIG. 12 is a schematic view of a cross-sectional configuration of a memory device (a memory device 5A) according to Modification Example 4 of the present disclosure. In the memory device 5A of the present modification example, for example, memory cells 13A and 13B are provided respectively between the metal film M3 and the metal film M4 that configure the first wiring layer 10 and between the metal film M4 and the metal film M5 that configure the first wiring layer 10.

In such a manner, the present technology allows the plurality of memory cells 13 to be formed between different wiring layers without changing wiring patterns of the wiring layers that configure the logic circuit 100.

6-5. Modification Example 5

FIG. 13 is a schematic view of a cross-sectional configuration of a memory device (a memory device 5B) according to Modification Example 5 of the present disclosure. In the memory device 5B of the present modification example, the memory cells 13A and 13B are provided respectively in the first wiring layer 10 and the second wiring layer 20.

The memory cells 13A and 13B that are provided in the memory device 5B of the present modification example are different in size in accordance with a design rule of the formed wiring layers. Specifically, a width of each of the selective element 11 and the memory element 12 that configure the memory cell 13A formed in the first wiring layer 10 is smaller than a width of each of the selective element 11 and the memory element 12 that configure the memory cell 13B formed in the second wiring layer 20. In general, in a case where thicknesses in the stacking direction are equal, the memory element 12 that is smaller in a width, that is, an element area exhibits more excellent high-speed operation, and the memory element 12 that is greater in an element area has higher reliability.

As described above, the memory device 5B having the configuration of the present disclosure allows for mixed mounting of the memory cells 13A and 13B that differ in characteristics on one substrate 41 without changing wiring patterns of the wiring layers that configure the logic circuit 100. This allows for mixed mounting of memory cells depending on the intended use, which makes it possible to further enhance functional capabilities of the memory device 5B.

6-6. Modification Example 6

FIG. 14 is a schematic view of a cross-sectional configuration of a memory device (a memory device 6) according to Modification Example 6 of the present disclosure. The memory device 6 of the present modification example has a configuration in which, for example, the barrier metal film 45 that is provided between the memory cell 13 and the bit line BL, in the memory device 1, is formed to be intentionally shifted from a position on the memory cell 13. The barrier metal film 45 functions as, for example, an electrode of the memory cell 13, and formation of the barrier metal film 45 in a shifted manner leads to a decrease in a contact area between the memory cell 13 and the barrier metal film 45 and an increase in a resistance value of the barrier metal film 45. Adjustment of the resistance value of the barrier metal film 45 in such a manner makes it possible to reduce degradation in the memory cell 13 that is caused by an unintended charge current.

6-7. Modification Example 7

FIG. 15 is a schematic view of a cross-sectional configuration of a memory device (a memory device 7) according to Modification Example 6 of the present disclosure. In the memory device 7 of the present modification example, for example, the barrier metal film 44, the memory cell 13, and the barrier metal film 45 that are provided between the word line EL and the bit line BL in the memory device 1 are formed using the damascene method.

In a case where, for example, the barrier metal film 44, the selective element 11, the memory element 12, and the barrier metal film 45 are formed in this order inside an opening 81H that is formed in, for example, an interlayer insulating film 81 using the damascene method, these are formed in layers on a side surface and a bottom surface of the opening 81H, as illustrated in FIG. 15. In a case where a memory cell having such a configuration is provided, it is necessary to form the bit line BL to come in contact with only the barrier metal film 45 that is formed at the innermost part inside the opening 81H.

In a case where an opening (a trench) is filled using the damascene method as describe above, an etching stopper film 83 is formed relatively thinly at a pertinent position (a middle of an opening) due to formation of a void in the middle. By utilizing this in the present modification example, the etching stopper film 83 is formed on the interlayer insulating film 81, and thereafter an opening 45H is formed using anisotropic etching, as illustrated in FIG. 15. This ensures that only a void part is etched, making it possible to form an opening H that configures the bit line BL in a self-aligned manner.

The present disclosure has been described thus far with reference to the first to fifth embodiments, as well as Modification Examples 1 to 7 thereof; however, the content of the present disclosure is not limited to the above-described embodiments, etc., and may be modified in a variety of ways. For example, the above-described embodiments, etc. exemplify a case where the selective element 11 to be configured is provided on the side of the word line WL, and the memory element 12 is provided on the side of the bit line BL. However, this is not limitative; the memory element 12 may be disposed on the side of the word line WL, and the selective element 11 may be disposed on the side of the bit line BL.

Further, in any of the memory devices 1, 2A, 2B, 3A, 3B, 4A, 4B, 5A, 5B, 6, and 7 of the present disclosure, a position between the wiring layers to be formed of the memory cell 13 is not limited. For example, the memory cell 13 may be formed between the metal film M2 and the metal film M3, or may be formed between the metal film M8 and the metal film M9. In addition, the above-described embodiments, etc. exemplify a case where the resistive random access memory element is used as the memory element 12. However, this is not limitative; for example, a spin injection memory element may be used. It is to be noted that the spin injection memory element has difficulty in microfabrication as compared with the resistive random access memory element. Therefore, in a case where the spin injection memory element is used, it is preferable to provide the spin injection memory element at any of vias V6 to V9 parts of the second wiring layer 20 or the third wiring layer 30.

It is to be noted that the effects described herein are merely exemplified. The effects of the present disclosure are not limited to the effects described herein. The content of the present disclosure may have any effects other than those described herein.

Further, for example, the present disclosure may have the following configurations.

(1)
A memory device including:
  a logic circuit in which a plurality of layers including wiring layers that are different in wiring pitches is stacked; and
  a memory element that is provided between the plurality of wiring layers.

(2)
The memory device according to (1), in which a selective element is provided along with the memory element between the plurality of wiring layers.

(3)
The memory device according to (1) or (2), in which
  the logic circuit includes a logic section, and a memory section in which the memory element is formed, and
  the logic section and the memory section have same wiring structure.

(4)
The memory device according to any one of (1) to (3), in which, in the plurality of wiring layers, a first wiring layer including a plurality of stacked wiring layers having dense wiring pitches, and a second wiring layer including a plurality of stacked wiring layers having wiring pitches that are sparser than the wiring pitches of the first wiring layer are stacked in this order.

(5)
The memory device according to (4), in which
  the memory element configures a memory cell along with a selective element, and
  the memory cell is provided between two wiring lines stacked in the first wiring layer.

(6)
The memory device according to (4), in which
  the memory element configures a memory cell along with a selective element, and
  the memory element of the memory cell is provided between wiring lines on one side among three wiring lines stacked inside the first wiring layer, and the selective element of the memory cell is provided between wiring lines on another side.

(7)
The memory device according to (4) or (5), in which
  the memory element configures the memory cell along with the selective element, and
  the memory cell and an electrically conductive film are stacked between two wiring lines stacked inside the first wiring layer.

(8)
The memory device according to any one of (4), (5), or (7), in which
  the memory element configures the memory cell along with the selective element, and
  the memory cell is provided between a plurality of wiring lines inside the first wiring layer.

(9)
The memory device according to (4), in which
  the memory element configures a memory cell along with a selective element, and
  the memory cell is provided to straddle the first wiring layer and the second wiring layer.

(10)
The memory device according to (9), in which the memory element is provided on side of the second wiring layer, and the selective element is provided on side of the first wiring layer.

(11)
The memory device according to any one of (4) to (10), in which
  the memory element configures the memory cell along with the selective element, and
  the memory cell is provided between wiring lines inside the first wiring layer and between wiring lines inside the second wiring layer.

(12)
The memory device according to any one of (2) to (11), in which
  each of the plurality of wiring layers includes a plurality of wiring lines, and
  a protective film is formed on side surfaces of the memory element and the selective element, the memory element and the selective element being provided on one wiring line of a wiring layer including the plurality of wiring lines, the protective film being formed inside a same wiring layer as the one wiring line and being continuous from an etching stopper film provided on a wiring line that configures the logic circuit.

(13)
The memory device according to any one of (1) to (12), in which the memory element includes a resistive random access memory element or a spin injection memory element.

(14)
A method of manufacturing a memory device, the method including:
  forming a logic circuit by stacking a plurality of wiring layers including layers that are different in wiring pitches; and
  forming a memory element between the plurality of wiring layers.

(15)
The method of manufacturing the memory device according to (14), in which
each of the plurality of wiring layers includes a plurality of wiring lines,
the method including
forming a memory cell including the memory element and a selective element on one wiring line of a wiring layer including the plurality of wiring lines, and
thereafter forming a via that performs coupling between the plurality of wiring layers on another wiring line formed inside a same wiring layer as the one wiring line.

(16)
The method of manufacturing the memory device according to (15), further including, after the formation of the memory cell on the one wiring line, collectively forming an etching stopper film and a protective film, the etching stopper film being used upon the formation of the via on the other wiring line, the protective film covering a side surface of the memory element.

(17)
The method of manufacturing the memory device according to (15) or (16), further including:
forming the selective element on the one wiring line; and
thereafter collectively forming a barrier metal film on the selective element and the other wiring line, thereby forming a barrier metal film that is different in film thickness on the selective element and the other wiring line.

(18)
The method of manufacturing the memory device according to any one of (15) to (17), further including forming an etching stopper film including materials that are different from each other on one wiring line of the wiring layer including the plurality of wiring lines and on the memory cell.

This application claims the benefit of Japanese Priority Patent Application JP2017-107840 filed with the Japan Patent Office on May 31, 2017, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A memory device, comprising:
a logic circuit including a plurality of layers, wherein
a first layer of the plurality of layers includes a first plurality of stacked wiring lines,
a second layer of the plurality of layers includes a second plurality of stacked wiring lines,
a wiring pitch of the first plurality of stacked wiring lines is different from a wiring pitch of the second plurality of stacked wiring lines,
the wiring pitch of the second plurality of stacked wiring lines is sparser than the wiring pitch of the first plurality of stacked wiring lines, and
the second plurality of stacked wiring lines is on the first plurality of stacked wiring lines;
a memory element between a first wiring line of the first plurality of stacked wiring lines and a wiring line of the second plurality of stacked wiring lines;
a first barrier metal film on a surface of the memory element;
a second barrier metal film on the first barrier metal film, wherein
the wiring line of the second plurality of stacked wiring lines is on the second barrier metal film; and
a selective element between the first wiring line of the first plurality of stacked wiring lines and a second wiring line of the first plurality of stacked wiring lines, wherein
the memory element and the selective element configure a memory cell, and
the memory cell is configured to straddle the first layer and the second layer.

2. The memory device according to claim 1, wherein
the logic circuit further includes a logic section and a memory section,
the memory element is in the memory section, and
the logic section and the memory section have same wiring structure.

3. The memory device according to claim 1, wherein the memory cell is inside the second layer.

4. The memory device according to claim 1, further comprising a protective film on side surfaces of the memory element and the selective element, wherein
the memory element and the selective element are on the second wiring line of the first plurality of stacked wiring lines of the first layer, and
the protective film is inside a same layer as the second wiring line and continuous from an etching stopper film on a third wiring line of the first plurality of stacked wiring lines that configures the logic circuit.

5. The memory device according to claim 1, wherein the memory element comprises one of a resistive random access memory element or a spin injection memory element.

6. A method of manufacturing a memory device, the method comprising:
forming a logic circuit by stacking a plurality of layers, wherein
a first layer of the plurality of layers includes a first plurality of stacked wiring lines,
a second layer of the plurality of layers includes a second plurality of stacked wiring lines,
a wiring pitch of the first plurality of stacked wiring lines is different from a wiring pitch of the second plurality of stacked wiring lines,
the wiring pitch of the second plurality of stacked wiring lines is sparser than the wiring pitch of the first plurality of stacked wiring lines, and
the second plurality of stacked wiring lines is on the first plurality of stacked wiring lines;
forming a memory element between a first wiring line of the first plurality of stacked wiring lines and a wiring line of the second plurality of stacked wiring lines;
forming a first barrier metal film on a surface of the memory element;
forming a second barrier metal film on the first barrier metal film, wherein
the wiring line of the second plurality of stacked wiring lines is on the second barrier metal film; and
forming a selective element between the first wiring line of the first plurality of stacked wiring lines and a second wiring line of the first plurality of stacked wiring lines, wherein
the memory element and the selective element configure a memory cell, and
the memory cell is configured to straddle the first layer and the second layer.

7. The method of manufacturing the memory device according to claim 6, further comprising:
- forming the memory cell including the memory element and the selective element on the second wiring line of the first plurality of stacked wiring lines; and
- forming, subsequent to the formation of the memory cell, a via that performs coupling between the plurality of layers on a third wiring line of the first plurality of stacked wiring lines of the first layer.

8. The method of manufacturing the memory device according to claim 7, further comprising, subsequent to the formation of the memory cell on the second wiring line of the first plurality of stacked wiring lines, collectively forming an etching stopper film and a protective film, wherein
- the etching stopper film is used upon the formation of the via on the third wiring line, and
- the protective film covers a side surface of the memory element.

9. The method of manufacturing the memory device according to claim 7, further comprising:
- forming the selective element on the second wiring line of the first plurality of stacked wiring lines; and
- collectively forming, subsequent to the formation of the selective element, a third barrier metal film on the selective element and the third wiring line, thereby forming the third barrier metal film that is different in film thickness on the selective element and the third wiring line.

10. The method of manufacturing the memory device according to claim 7, further comprising forming an etching stopper film on the second wiring line of the first plurality of stacked wiring lines and on the memory cell,
- wherein the etching stopper film includes a first material and a second material different from the first material.

* * * * *